US010643939B2

(12) United States Patent
Kariyazaki et al.

(10) Patent No.: US 10,643,939 B2
(45) Date of Patent: May 5, 2020

(54) HIGH SPEED SEMICONDUCTOR DEVICE WITH NOISE REDUCTION WIRING PATTERN

(71) Applicant: RENESAS ELECTRONICS CORPORATION, Tokyo (JP)

(72) Inventors: Shuuichi Kariyazaki, Tokyo (JP); Keita Tsuchiya, Tokyo (JP); Yoshitaka Okayasu, Tokyo (JP); Wataru Shiroi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/057,724

(22) Filed: Aug. 7, 2018

(65) Prior Publication Data
US 2019/0115295 A1  Apr. 18, 2019

(30) Foreign Application Priority Data
Oct. 13, 2017  (JP) .................... 2017-199633

(51) Int. Cl.
*H01L 23/498* (2006.01)
*H01L 23/00* (2006.01)

(52) U.S. Cl.
CPC .. *H01L 23/49838* (2013.01); *H01L 23/49822* (2013.01); *H01L 24/05* (2013.01); *H01L 24/06* (2013.01); *H01L 24/13* (2013.01); *H01L 24/16* (2013.01); *H01L 24/17* (2013.01); *H01L 24/32* (2013.01); *H01L 24/48* (2013.01); *H01L 24/73* (2013.01); *H01L 24/81* (2013.01); *H01L 24/92* (2013.01); *H01L 2224/0401* (2013.01); *H01L 2224/05082* (2013.01); *H01L 2224/05083* (2013.01); *H01L 2224/05147* (2013.01); *H01L 2224/05155* (2013.01); *H01L 2224/05166* (2013.01); *H01L 2224/05624* (2013.01);
(Continued)

(58) Field of Classification Search
CPC ......... H01L 23/49838; H01L 23/49827; H01L 23/49822; H01L 23/49816; H01L 24/05; H01L 24/81; H01L 24/13; H01L 24/92; H01L 2924/3011
USPC ........ 257/737, 776, 777, 778; 438/108, 280, 438/613, 619
See application file for complete search history.

(56) References Cited

U.S. PATENT DOCUMENTS 6,407,462 B1 * 6/2002 Banouvong et al. ... H01L 24/10
257/787
2011/0193215 A1   8/2011 Toyama et al.

FOREIGN PATENT DOCUMENTS

JP   2011-165858 A   8/2011

* cited by examiner

*Primary Examiner* — Thinh T Nguyen
(74) *Attorney, Agent, or Firm* — McDermott Will & Emery LLP

(57) ABSTRACT

A semiconductor device has a wiring substrate on which a semiconductor chip is mounted. A wiring layer of the wiring substrate has a wiring. This wiring has a main wiring unit extending in a direction "X" and a plurality of sub-wiring units extending in a direction "Y", in a cross sectional view, and is supplied with a power source potential. The wiring layer has a wiring. This wiring has a main wiring unit extending in the direction "X" and a plurality of sub-wiring units extending in the direction "Y", in a cross sectional view, and is supplied with a reference potential. The sub-wiring units and the sub-wiring units have end units and end units on a side opposed to the end units, and are alternately arranged along the direction "X" between the main wiring units. To the end units, via wirings are coupled.

18 Claims, 23 Drawing Sheets

(52) U.S. Cl.
CPC ............... *H01L 2224/05644* (2013.01); *H01L 2224/05647* (2013.01); *H01L 2224/05655* (2013.01); *H01L 2224/06133* (2013.01); *H01L 2224/06515* (2013.01); *H01L 2224/13111* (2013.01); *H01L 2224/16227* (2013.01); *H01L 2224/17133* (2013.01); *H01L 2224/32225* (2013.01); *H01L 2224/48227* (2013.01); *H01L 2224/73204* (2013.01); *H01L 2224/73265* (2013.01); *H01L 2224/81193* (2013.01); *H01L 2224/81815* (2013.01); *H01L 2224/92125* (2013.01); *H01L 2924/15311* (2013.01); *H01L 2924/15313* (2013.01); *H01L 2924/3011* (2013.01); *H01L 2924/351* (2013.01)

HIGH SPEED SEMICONDUCTOR DEVICE WITH NOISE REDUCTION WIRING PATTERN

CROSS-REFERENCE TO RELATED APPLICATIONS

The disclosure of Japanese Patent Application No. 2017-199633 filed on Oct. 13, 2017 including the specification, drawings and abstract is incorporated herein by reference in its entirety.

BACKGROUND

The present invention relates to a semiconductor device and relates to an effective technology applicable to a semiconductor device including a power source circuit driving a circuit operating at a high speed.

For example, Japanese Unexamined Patent Application Publication No. 2011-165858 discloses a semiconductor device in which a semiconductor chip mounted on a wiring substrate are electrically coupled to the wiring substrate through a plurality of wires. Japanese Unexamined Patent Application Publication No. 2011-165858 discloses that parasitic inductance can be reduced by arranging, in plan view, a plurality of power source pads for supplying a power source between comb-shaped ground pads for supplying a ground voltage.

SUMMARY

As semiconductor chips have high performance, there is required some technique for downsizing parts, the high speed operation of circuits, or reduction in consumption power due to reduction in a circuit driving voltage. The present inventors have performed technological development for improving the performance of semiconductor devices. As part of this, they have examined the reduction of noise in a circuit supplying a power source voltage to a semiconductor chip mounted on the wiring substrate, and have found that there is room for improvement.

For example, the arrangement pitches of ends in the semiconductor chip are narrowed, while the arrangement pitches of through holes in the wiring substrate on which the semiconductor chip are mounted can not sufficiently be narrowed. In this case, a part with a narrow wiring width is interposed in a wiring path for coupling the ends of the semiconductor chips and the through holes of the wiring substrate. In the part with a narrow wiring width, the electric resistance is high.

Any other objects and new features will be apparent from the detailed descriptions of the present specification and the accompanying drawings.

A semiconductor device according to an embodiment has a wiring substrate on which a semiconductor chip is mounted. A first wiring layer of the wiring substrate has a first wiring. The first wiring has, in plan view, a first main wiring unit extending in a first direction and a plurality of sub-wiring units extending in a second direction, and is provided with a first potential. The first wiring has, in the cross sectional view, a second wiring having a second main wiring unit extending in the first direction and a plurality of second sub-wiring units, extending in the second direction, and is supplied with a second potential. The first sub-wiring units and the second sub-wiring units have a first end unit and a second end unit on a side opposed to the first end unit, are alternately arranged along the first direction. Vias are coupled to the first end unit and the second end unit.

According to the embodiment, it is possible to improve performance of the semiconductor device.

Figure 1:
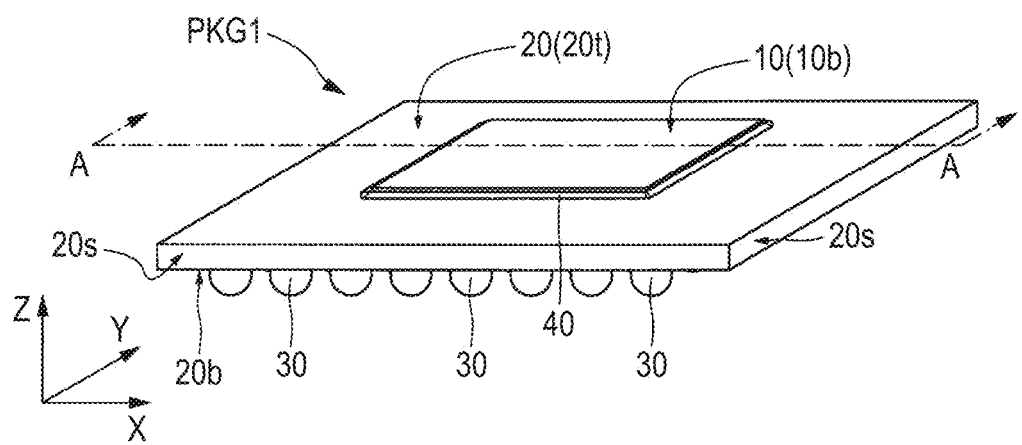
FIG. 1 is a perspective view illustrating a semiconductor device according to an embodiment.

DETAILED DESCRIPTION (Description Format/Basic Terms/Descriptions of Usage in Present Application)

In the following preferred embodiment of the present application, if necessary for convenience sake, descriptions will be made to divided plural sections or preferred embodiment, however, unless otherwise specified, they are not mutually independent. Regardless of before or after the descriptions, each of the parts of a single example, that is, one is a part of details or whole modification of the other. In principle, the same parts are not described over and over. The constituent elements in the preferred embodiments are not essential, except when specified that it is not the case, except when the number is theoretically limited, or except when it is not obvious in the context.

In the following preferred embodiments, even when it is described as "X formed from A" for some material or composition, it is not to exclude any elements other than "A", except when specified that it is not the case, and except when it is not obvious in the context. For example, it implies that a component is "X including A as a main component". For example, when it implies "silicon member", it is not limited to pure silicon. Needless to say, it may be a member including a multi-component alloy including SiGe (silicon/germanium) alloy or other silicon as the main component or any other additives. When it implies "gold plated", "Cu layer", or "nickel plated", it is not limited only to a pure material thereof, and it may be a member including gold, Cu, or nickel as the main component, except when specified that it is not the case.

In the case of reference to a specified numerical value or number of elements, except when it is specified it is not the case, except when the number is theoretically limited, or except when it is not obvious in the context, a number over or below the specified one may be used.

In the illustrations of the preferred embodiments, the same or similar parts are identified by the similar symbols or reference numerals, and thus will not substantially be described over and over.

In the attached illustrations, to avoid a troublesome operation or when a clear distinction from a gap is obvious, hatching may not be provided even in cross section. In this context, when it is obvious from the descriptions, the contour of the background may not be provided, even when there is given a hole closed in a plane. Further, to clearly identify that there is no gap even without cross section, or to clearly identify the boundary of a region, hatching or dot-pattern may be provided.

<Semiconductor Device>

Figure 2:
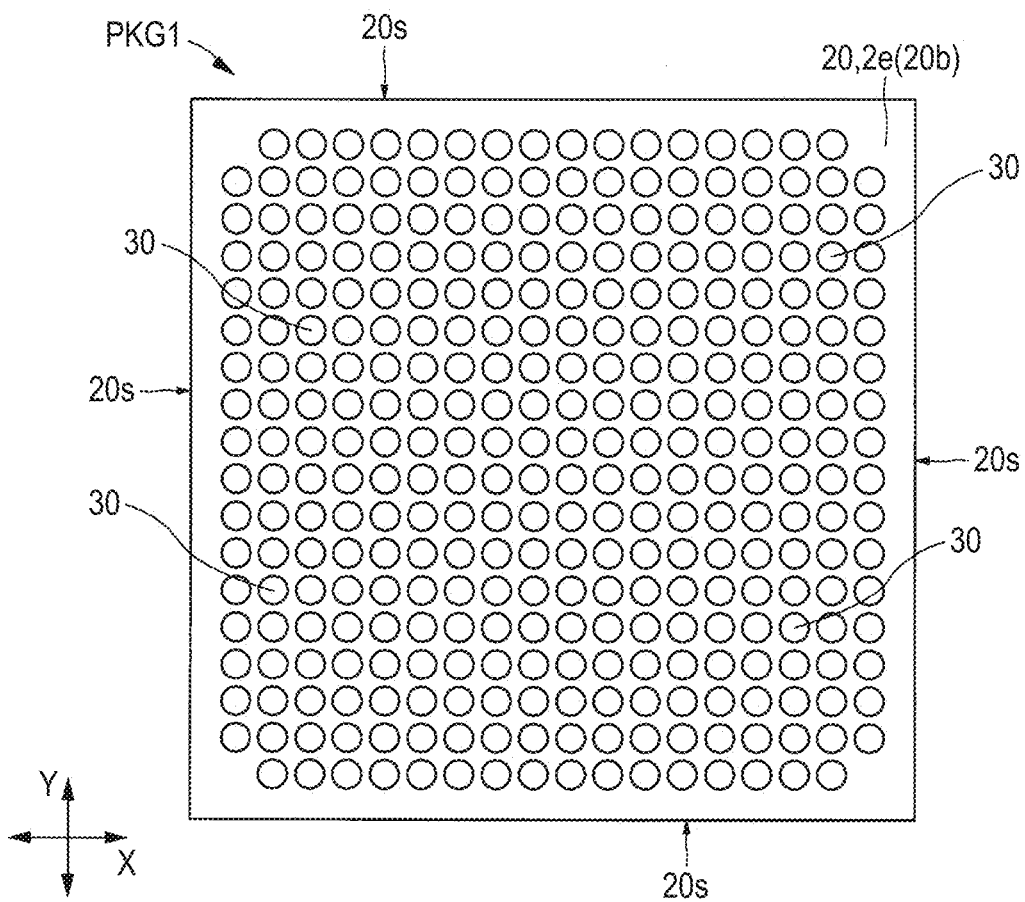
FIG. 2 is a bottom view of the semiconductor device illustrated in FIG. 1.
Figure 3:
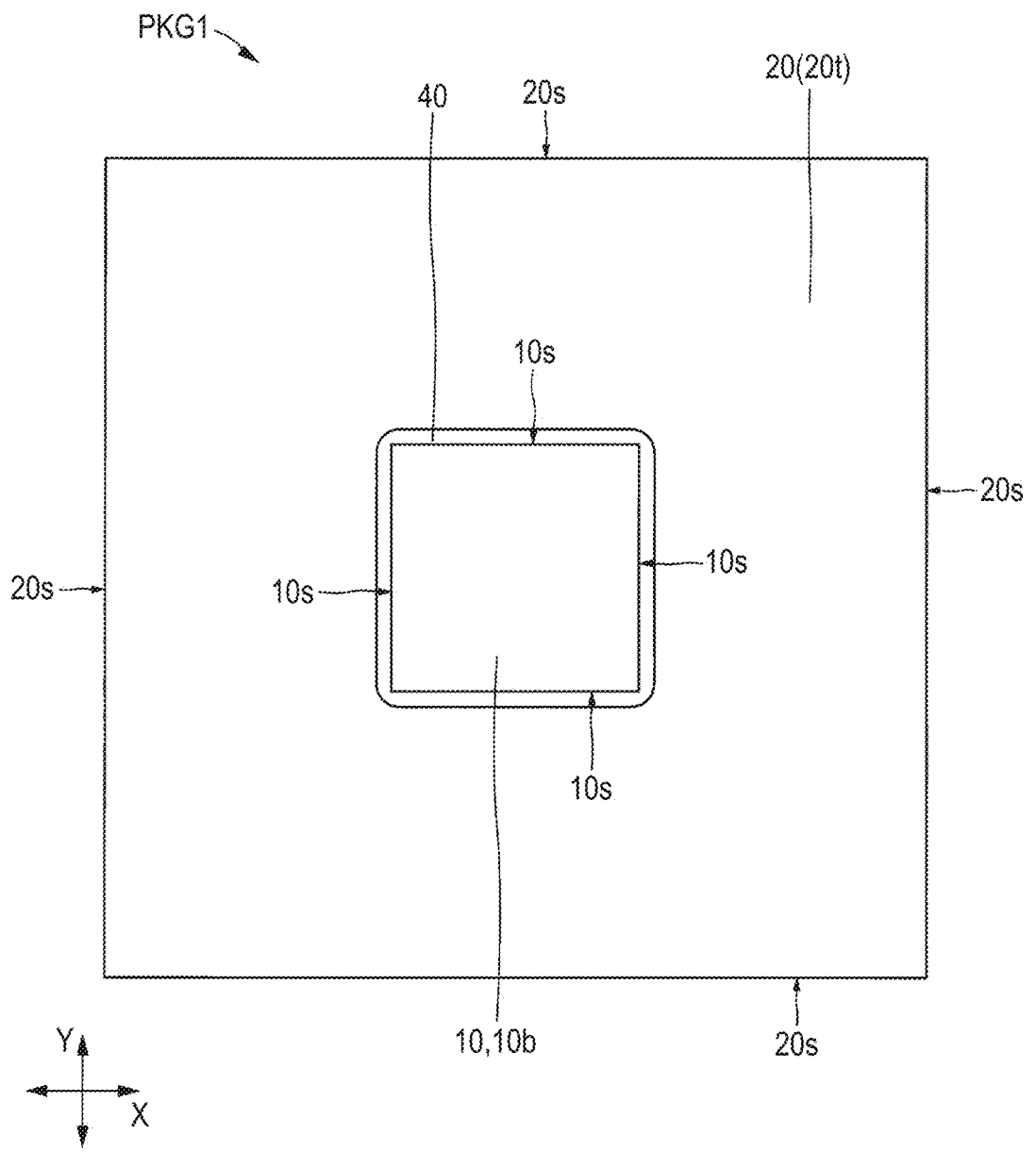
FIG. 3 is a top view of the semiconductor device illustrated in FIG. 1.
Figure 4:
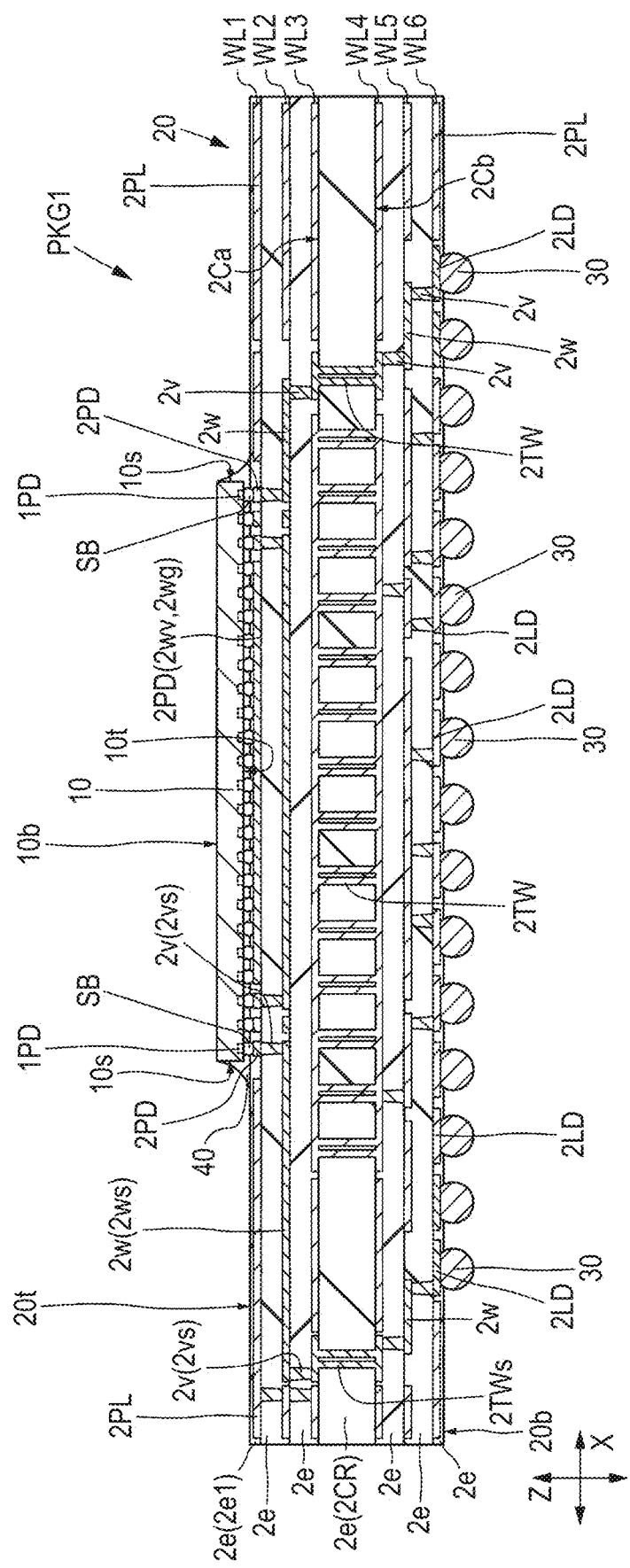
FIG. 4 is a cross sectional view taken along a line A-A of FIG. 1.

The schematic configuration of a semiconductor device PKG1 according to a preferred embodiment will be described using FIG. 1 to FIG. 4. FIG. 1 is a perspective view of a semiconductor device according to this embodiment. FIG. 2 is a bottom view of the semiconductor device illustrated in FIG. 1. FIG. 3 is a top view of the semiconductor device illustrated in FIG. 1. FIG. 4 is a cross sectional view taken along a line A-A of FIG. 1. For the sake of easy illustrations, FIG. 1 to FIG. 4 illustrate a less number of terminals. For the sake of easy illustration, FIG. 4 illustrates a lesser number of external terminals 30 than the example illustrated in FIG. 2. Though not illustrated, various modifications may be possibly applied to the number of terminals (terminals 2PD, lands 2LD, external terminals 30), other than the examples of FIG. 1 to FIG. 4.

As illustrated in FIG. 1, the semiconductor device PKG1 of this embodiment has a semiconductor chip 10 and a wiring substrate 20 having an upper surface (surface, main surface, chip-mounting surface) 20t on which the semiconductor chip 10 is mounted.

As illustrated in FIG. 4, the semiconductor chip 10 has a surface (main surface, upper surface) 10t, a back surface (main surface, lower surface) 10b on the side opposed to the surface 10t, and side surfaces 10s in a position between the surface 10t and the back surface 10b. The semiconductor chip 10 has a rectangular outer shape with a plane area smaller than that of the wiring substrate 20 in plan view, as illustrated in FIG. 3. In the example illustrated in FIG. 3, the semiconductor chip 10 is mounted in the center part of the upper surface 20t of the wiring substrate 20 in a manner that four side surfaces 10s extend respectively along four side surfaces 20s of the wiring substrate 20.

As illustrated in FIG. 4, a plurality of electrodes (chip electrodes, electrode pads, and electrode parts) 1PD are arranged on the surface 10t of the semiconductor chip 10. In this embodiment, the electrodes 1PD are arranged in matrix (matrix, array) on the surface 10t of the semiconductor chip 10. The matrix arrangement of the electrodes 1PD as external input/output terminals of the semiconductor chip 10 enables suppression of an increase in the plane area, even if the number of electrodes of the semiconductor chip 10 increases. In plan view, when the electrode 1PD for power supply is arranged in the center part of the semiconductor chip 10, it is possible to shorten a power supply path for a core circuit formed in the center part of the semiconductor chip 10.

The surface 10t of the semiconductor chip 10 is opposed to the upper surface 20t of the wiring substrate 20. In this manner, the semiconductor chip 10 is mounted on the wiring substrate 20 in a manner that the surface 10t as the electrode formation surface of the semiconductor chip 10 is opposed to the upper surface 20t as the chip-mounting surface of the wiring substrate 20. This mounting system is called a face-down mounting system or a flip-chip coupling system.

In the case of the flip-chip coupling system, coupling is made between the electrodes 1PD arranged on the surface 10t of the semiconductor chip 10 and the terminals 2PD arranged on the upper surface 20t of the wiring substrate 20, through bump electrodes SB. As illustrated in FIG. 4, the bump electrodes SB are coupled to the electrodes 1PD, while the electrodes 1PD of the semiconductor chip 10 and the terminals 2PD of the wiring substrate 20 are electrically coupled respectively through the bump electrodes SB.

The bump electrodes SB are metal members which are formed to project above the surface 10t of the semiconductor chip 10. In this embodiment, the bump electrodes SB are so-called solder bumps in which a solder member is laminated on the electrode 1PD through an under bump metal film. The under bump metal film is, for example, a laminated film in which titanium (Ti), copper (Cu), and nickel (Ni) are laminated sequentially from the side of the coupling surface with the electrodes 1PD (in this case, a gold (Au) film may be further formed on the nickel film). The solder member for forming the solder bump is formed from a so-called lead-free solder which does not substantially include Pb or an Sn—Pb solder member including lead (Pb). Examples of the lead-free solder are tin (Sn) only, tin-bismuth (Sn—Bi), tin-copper-argentum (Sn—Cu—Ag), or tin-copper (Sn—Cu). The lead-free solder represents a solder in which a content of lead is 0.1 wt % or lower. This content is based on RoHS (Restriction of Hazardous Substances) instructions.

When the semiconductor chip 10 is mounted on the wiring substrate 20, the solder bumps are formed on the electrodes 1PD and the terminals 2PD in advance, and then heat treatment (reflow treatment) is performed in a state where the solder bumps are in contact with each other. By so doing, the solder bumps are incorporated together, and the bump electrodes SB are formed. As a modification of this embodiment, a pillar bump may be used as each of the bump electrodes SB. The pillar bump is formed in a manner that a solder film is formed on the tip surface of a conductor pillar formed from copper (Cu) or nickel (Ni).

Though not illustrated, as a modification of this embodiment, the back surface 10b of the semiconductor chip 10 may be opposed to the chip-mounting surface (upper surface 20t) of the wiring substrate 20 (called a face-up packaging system). In this case, the electrodes 1PD of the semiconductor chip 10 are arranged on the periphery of the surface 10t. The electrodes 1PD of the semiconductor chip 10 are electrically coupled to the terminals 2PD of the wiring substrate 20, through a non-illustrative wire. Like this embodiment, when the semiconductor chip 10 is mounted on the wiring substrate 20 using the face-down system, it is possible to improve the arrangement density of the electrodes 1PD per unit area. Like this embodiment, when the electrodes 1PD of the semiconductor chip 10 and the wiring substrate 20 are electrically coupled through the bump electrodes SB, the impedance of the transmission path between the electrodes 1PD and the terminals 2PD can be lowered than the coupling system with the wire.

Though not illustrated, a plurality of semiconductor elements (circuit elements) are formed on the main surface of the semiconductor chip 10 (specifically, a semiconductor-element formation region provided on the element formation surface of the semiconductor substrate as the base material of the semiconductor chip 10). The electrodes 1PD are electrically coupled to the semiconductor elements through the wiring (not illustrated) formed on the wiring layer arranged inside the semiconductor chip 10 (specifically, between the surface 10t and a non-illustrative semiconductor-element formation region).

The semiconductor chip 10 (specifically, the base material of the semiconductor chip 10) is formed from, for example, silicon (Si). An insulating film covering the base material of the semiconductor chip 10 and the wiring is formed on the surface 10t. The surface of each of the electrodes 1PD is exposed from the insulating film, through the opening formed in this insulating film. The electrodes 1PD are formed from metal, for example, aluminum (Al) or copper (Cu), in this embodiment.

As illustrated in FIG. 4, the wiring substrate 20 on which the semiconductor chip 10 is mounted has the upper surface 20t on which the semiconductor chip 10 are formed, a lower surface (surface, main surface, mounting surface) 20b on the side opposed to the upper surface 20t, and a plurality of side surface 20s (see FIG. 1 to FIG. 3) arranged between the upper surface 20t and the lower surface 20b. As illustrated in FIG. 2, the wiring substrate 20 has a rectangular outer shape in plan view.

The wiring substrate 20 has a plurality of wiring layers for electrically coupling the terminals 2PD of the upper surface 20t as the chip-mounting surface and the lands 2LD of the lower surface 20b as the mounting surface. In the example illustrated in FIG. 4, the wiring layer has six layers of wiring layers WL1, WL2, WL3, WL4, WL5, and WL6, sequentially from the side of the upper surface 20t. Each of the wiring layers is covered by an insulating film 2e. The insulating film 2e covering each of the wiring layers has a plurality of openings provided therein. In each of the openings, a via wiring (via, interlayer conductive path) 2v is buried. The wiring layers WL1, WL2, and WL3 and the wiring layers WL4, WL5, and WL6 are electrically coupled to each other through the via wirings.

The wiring layers of the wiring substrate 20 are formed by laminating the wiring layers on an upper surface 2Ca and a lower surface 2Cb of an insulating layer (core layer, core member, core insulating film) 2CR, using a build-up process. The insulating layer 2CR is formed from, for example, a prepreg member in which glass fibers are impregnated with a resin. The wiring layer WL3 on the upper surface 2Ca of the insulating film 2CR and the wiring layer WL4 on the lower surface 2Cb are electrically coupled with each other through a plurality of through hole wirings (interlayer conductive paths) 2TW which are buried in a plurality of through holes provided for penetrating from one of the upper surface 2Ca and the lower surface 2Cb to the other one.

FIG. 4 illustrates the wiring substrate 20 having the insulating film 2CR as the core layer, as an example of the wiring substrate. However, it is possible to use a so-called coreless substrate without the core layer, as a modification of FIG. 4. In this case, the through hole wiring 2TW is not formed on the wiring substrate in the modification. On this wiring substrate of the modification, the laminated wiring layers are electrically coupled with each other through the via wirings 2v provided between the wiring layers.

The terminals (terminal units, pads, semiconductor-chip coupling terminals) 2PD which are electrically coupled to the semiconductor chip 10 are formed on the upper surface 20t of the wiring substrate 20. The terminals 2PD are internal interface terminals for electrically coupling the semiconductor chip 10 and the wiring substrate 20. On the lower surface 20b of the wiring substrate 20, the lands (terminals, external terminals, electrodes, external electrodes) 2LD as input/output terminals of the semiconductor device PKG1 are formed. The lands 2LD are external interface terminals for electrically coupling the wiring substrate 20 and the external device (for example, non-illustrative mounting substrate).

The terminals 2PD and the lands 2LD are electrically coupled with each other through a plurality of wirings 2w formed on the wiring substrate 20, the via wirings 2v as interlayer conductive paths, and the through hole wirings 2TW for electrically coupling the wiring layer WL3 and the wiring layer WL4. In the example of FIG. 4, there is formed the insulating film 2CR as the core layer between the wiring layer WL3 and the wiring layer WL4 of the wiring substrate 20. The core layer has a thickness and hardness greater than any other insulating film 2e. Thus, the insulating layer 2CR includes a plurality of through holes provided for penetrating from one to the other, of the upper surface 2Ca and the lower surface 2Cb of the insulating layer 2CR. In each of the through holes, a conductor (metal, for example, copper) is buried, thereby forming the through hole wiring 2TW which function as the interlayer conductive path. The detailed configuration of each wiring layer included in the wiring substrate 20 will be described later.

In the example of FIG. 4, the lands 2LD are coupled to the external terminals (solder ball, solder member, electrode, and external electrode) 30. The external terminals 30 are conductive members for electrically coupling a plurality of terminals (not illustrated) on the side of a non-illustrative mounting substrate with the lands 2LD, when the semiconductor device PKG1 is mounted on the mounting substrate. The external terminals 30 are formed, for example, from a lead-free solder, like the above-described bump electrodes SB.

As illustrated in FIG. 2, the external terminals 30 are arranged in matrix (matrix, array). Though not illustrated in FIG. 2, the lands 2LD (see FIG. 4) joined to the external terminals 30 are arranged also in matrix. This semiconductor device is called an area array type semiconductor device. Specifically, in this semiconductor device, the external terminals (external terminals 30, lands 2LD) are arranged in matrix on the side of the mounting surface of the wiring substrate 20. The area array type semiconductor device is preferable from the standpoint of suppressing an increase in the mounting area of the semiconductor device even if the number of external terminals increases, because it is possible to effectively use the side of the mounting surface (lower surface 20b) of the wiring substrate 20 as an arrangement space for the external terminals. That is, it is possible to mount the semiconductor device with space saving, even if the number of external terminals increases due to high functions and high integrations.

FIG. 1, FIG. 2, and FIG. 4 illustrate an example of a so-called BGA (Ball Grid Array) type semiconductor package, using solder balls as solder members with a ball-like shape, as the external terminals 30. However, various modifications may be made to the arrangement and structure of the external terminals. For example, a modification may be made to have the structure in which the lands 2LD are exposed in the lower surface 20b illustrated in FIG. 4, or the structure in which a thin solder member is jointed to the lands 2LD exposed in the lower surface 20b. The semiconductor package with the modification is called an LGA (Land Grid Array) type.

As illustrated in FIG. 4, an underfilling resin (insulating resin) 40 is arranged between the semiconductor chip 10 and the wiring substrate 20. The underfilling resin 40 is arranged to fill up the gap between the surface 10t of the semiconductor chip 10 and the upper surface 20t of the wiring substrate 20. The underfilling resin 40 is formed from an insulating (non-conductive) material (for example, a resin material), and is arranged to seal an electrical coupling part (joint part of bump electrodes SB) of the semiconductor chip 10 and the wiring substrate 20. In this manner, by arranging the underfilling resin 40 to seal the coupling part of the bump electrodes SB, it is possible to relax stress occurring at the electrical coupling part of the semiconductor chip 10 and the wiring substrate 20.

<Example of Circuit Configuration>

Figure 5:
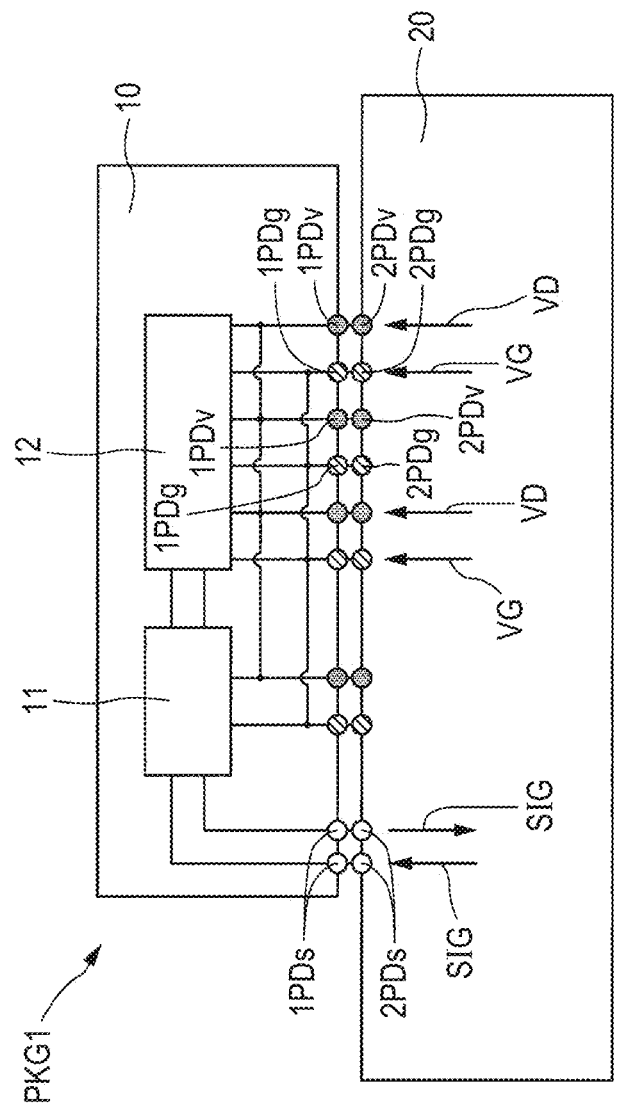
FIG. 5 is an explanatory diagram schematically illustrating a circuit configuration example of a semiconductor chip illustrated in FIG. 4.
Figure 6:
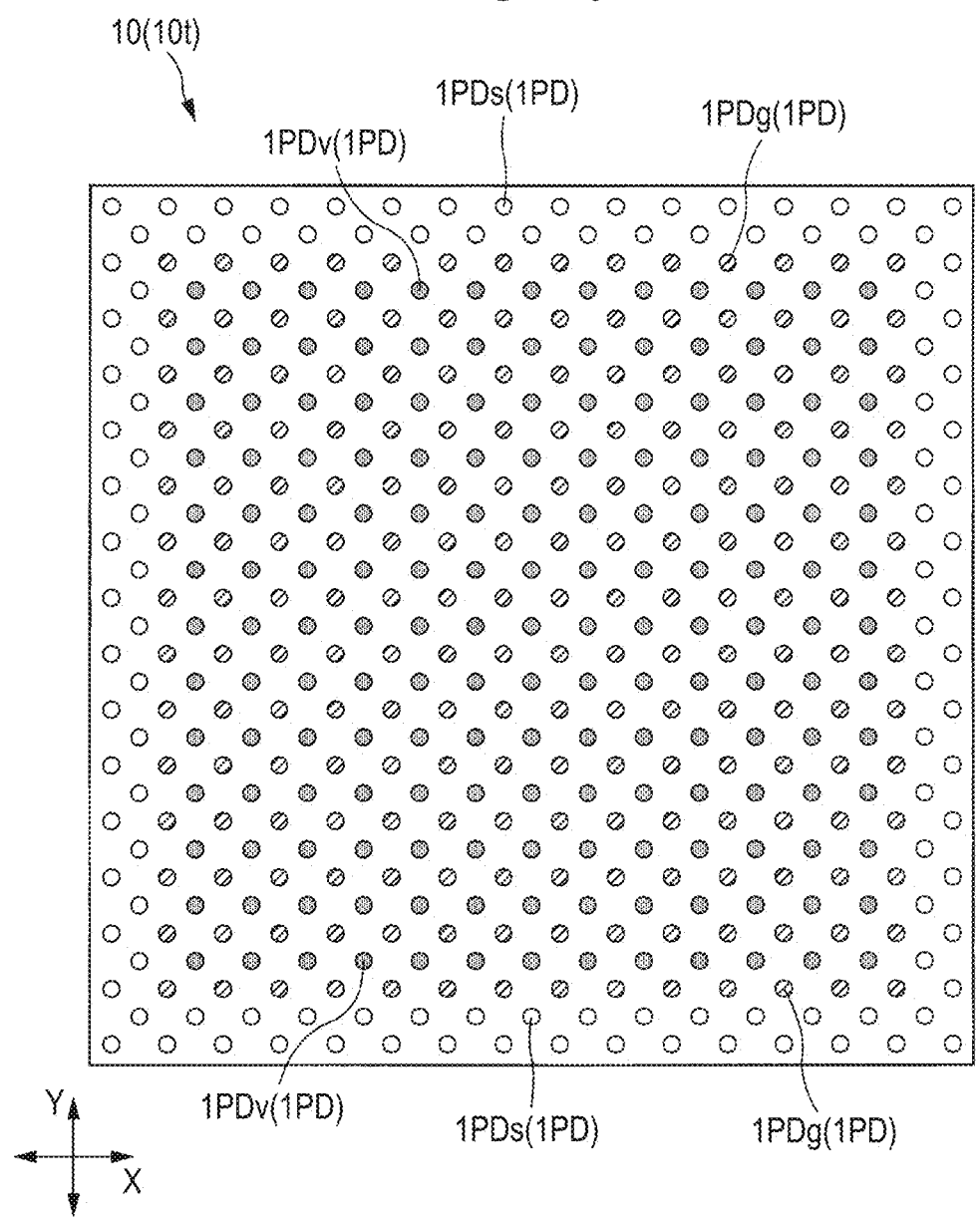
FIG. 6 is a plan view of the surface (electrode arrangement surface) of the semiconductor chip illustrated in FIG. 1.

Descriptions will now be made to an example of a circuit configuration included in the semiconductor chip illustrated in FIG. 4. FIG. 5 is an explanatory diagram schematically illustrating an example of a circuit configuration included in the semiconductor chip illustrated in FIG. 4. FIG. 6 is a plan view of a surface (electrode arrangement surface) of the semiconductor chip illustrated in FIG. 1. Though FIG. 6 is a plan view, a dot pattern and a hatching pattern are provided to identify a plurality of electrodes 1PDv, a plurality of electrodes 1PDg, and a plurality of electrodes 1PDs. In FIG. 6, of the electrodes 1PD illustrated in the form of a circle, the electrodes 1PDs are illustrated in blank, the electrodes 1PDv are illustrated in a dot pattern, and the electrodes 1PDg are illustrated in a hatching pattern.

As illustrated in FIG. 5, the semiconductor chip 10 has an input/output circuit 11 and a core circuit 12. The input/output circuit 11 inputs or outputs an electrical signal SIG with the external of the semiconductor chip 10. The core circuit 12 is coupled to the input/output circuit 11, and performs a process (for example, a calculation process) for signal data. The electrodes 1PD of the semiconductor chip 10 include the electrodes 1PDs, the electrodes 1PDv, and the electrodes 1PDg. Each of the electrodes 1PDs is a signal terminal which is coupled to the input/output circuit 11 and transmits an electrical signal. Each of the electrodes 1PDv is a power source terminal which is coupled to the core circuit 12 and supplies a power source potential VD for driving the core circuit 12. The electrodes 1PDv are coupled to each other. Each of the electrodes 1PDg is a reference potential terminal which is coupled to the core circuit 12 and supplies the core circuit 12 with a reference potential VG. The electrodes 1PDg are coupled to each other.

In the example illustrated in FIG. 5, the electrodes 1PDv and the electrodes 1PDg are electrically coupled also to the input/output circuit 11. To the input/output circuit 11, the power source potential VD is supplied from the electrodes 1PDv, while the reference potential VG is supplied from the electrodes 1PDg. The input/output circuit 11 can be driven by a potential difference between the power source potential VD and the reference potential VG. Like the example illustrated in FIG. 5, when the electrodes 1PDv are electrically coupled with each other, a power source potential is supplied from a plurality of paths, if the electric power demand has momentarily increased in, for example, the core circuit 12. Thus, if the power source potential can stably be supplied to the electrodes 1PDv, it is possible to prevent occurrence of a voltage drop due to a momentary increase in the power demand. In a modification of the example illustrated in FIG. 5, when driving voltages differ between the input/output circuit 11 and the core circuit 12, a power source potential different from the power source potential VD may be supplied to the input/output circuit 11. When there are a plurality of core circuits 12, and when they operate by different driving voltages, different power source potentials may be supplied to the core circuits 12. In this case, the electrodes 1PDv may be divided into groups (groups of electrodes) of a few electrodes. In this case, if the groups are electrically divided, it is possible to supply power source potentials which are different between the groups. Note, however, that there are preferably a plurality of paths for supplying the power source potentials, to suppress a voltage drop due to a momentary increase in the power demand, as described above.

As described in FIG. 6, on the surface 10t of the semiconductor chip 10, the electrodes 1PDs, the electrodes 1PDv, and the electrodes 1PDg are regularly arranged. The electrodes 1PDv and the electrodes 1PDg are arranged the most in the center part of the surface 10t. The electrodes 1PDs are arranged the most on the side of the outer periphery, in other words, the outer edge and the peripheral part in the center part of the surface 10t.

Figure 10:
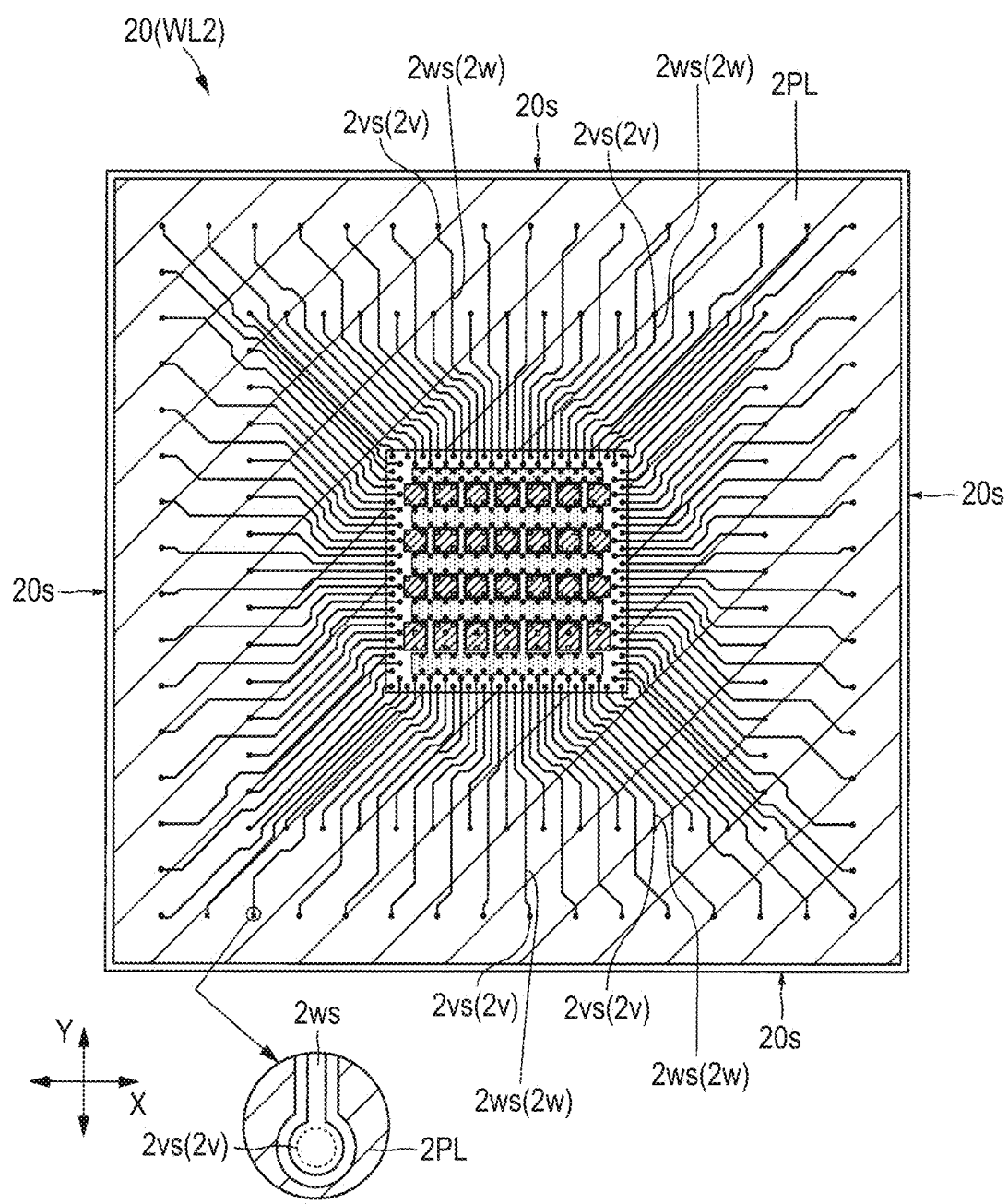
FIG. 10 is a plan view illustrating a layout example of a wiring layer as the second layer, on the wiring substrate of FIG. 7.

In the example illustrated in FIG. 6, the electrodes 1PDs are arranged in the outermost periphery and in one inner periphery from the outermost periphery, of the arrangements of the electrodes 1PD. A wiring path for transmitting the electrical signal SIG (see FIG. 5) is pulled out to the outer peripheral side of the wiring substrate 20, as a wiring 2ws, as illustrated in FIG. 10. Thus, on the surface 10t of the semiconductor chip 10, the electrodes 1PDs transmitting the electrical signal SIG are arranged on the outer peripheral side, thereby enabling to reduce the path distance of the signal transmission path.

The electrodes 1PDv and the electrodes 1PDg are arranged inside the electrodes 1PDs on the surface 10t. In other words, the electrodes 1PDs are arranged between the electrodes 1PDv, the electrodes 1PDg, and the outer periphery of the surface 10t. The core circuit 12 (see FIG. 5) is formed to overlap with the center part of the surface 10t (a part in which the electrodes 1PDv and the electrodes 1PDg are arranged) in plan view. The above-described input/output circuit 11 (see FIG. 5) is formed between the center part and the outer periphery of the surface 10t in plan view. The electrodes 1PDv and the electrodes 1PDg are formed to overlap with the core circuit 12, thereby enabling to shorten the power source supply path for the core circuit 12. This results in reducing power loss or noise when supplying electric power to the core circuit 12.

In the example illustrated in FIG. 6, of the arrangements of the electrodes 1PD on the surface 10t, the electrodes 1PD and the electrodes 1PDg are not arranged in the outermost periphery and in one inner periphery from the outermost periphery. Of the arrangements of the electrodes 1PD on the surface 10t, the electrodes 1PDs are not arranged in two or more inner periphery from the outermost periphery (outermost periphery and the periphery except the one inner periphery from the outermost periphery). FIG. 6, however, illustrates an ideal configuration in which the electrodes 1PDs for signal transmission are arranged on the outer peripheral side, and the electrodes 1PDv and the electrodes 1PDg for supplying a driving voltage are arranged in the center part, on the surface 10t of the semiconductor chip 10. Therefore, various modifications are possible for the arrangement of the electrodes 1PD.

For example, a part of the electrodes 1PDs may be arranged in two or more inner periphery from the outermost periphery, of the arrangement of the electrodes 1PD of the surface 10t. The electrodes 1PDv or the electrodes 1PDg may be arranged in the outermost periphery or in one inner periphery from the outermost periphery. For example, for signal transmission, the signal transmission path and a reference path may be formed in parallel with each other. As this reference path, when the transmission path for the reference potential is used, the electrodes 1PDg for the reference potential are preferably arranged in the vicinity of the electrodes 1PDs. In this case, a part of the electrodes 1PDg is preferably arranged in the outermost periphery or in one inner periphery from the outermost periphery, of the arrangement of the electrodes 1PD.

As illustrated in FIG. 6, in the center part of the surface 10t, the electrodes 1PDv and the electrodes 1PDg are arranged as follows. That is, the electrodes 1PDv and the electrodes 1PDg are arranged in a row along the direction "X". In the direction crossing (orthogonal to, in FIG. 6) the direction "X", the row of the electrodes 1PDv and the row of the electrodes 1PDg are alternately arranged. The electrodes 1PD are arranged in zigzag.

The term "arranged in zigzag" can be expressed as follows. That is, the electrodes 1PD in the first row along the direction "Y" are arranged between the adjacent electrodes 1PD, of the electrodes in the second row along the direction "Y", while the electrodes 1PD in the second row are arranged between the adjacent electrodes 1PD of the electrodes 1PD in the first row. The electrodes 1PD in the third row along the direction "Y" are arranged between the adjacent electrodes 1PD, of the electrodes 1PD in the second row along the direction "Y", while the electrodes 1PD in the second row are arranged between the adjacent electrodes 1PD, of the electrodes 1PD in the third row. The electrodes 1PD in the first row along the direction "X" are arranged between the adjacent electrodes 1PD, of the electrodes 1PD in the second row along the direction "X", while the electrodes 1PD in the second row are arranged between the adjacent electrodes 1PD, of the electrodes 1PD in the first row. The electrodes 1PD in the third row along the direction "X" are arranged between the adjacent electrodes 1PD, of the electrodes in the second row along the direction "X", while the electrodes 1PD in the second row are arranged between the adjacent electrodes 1PD, of the electrodes 1PD in the third row.

To stably operate the circuit 12, it is necessary to stably supply a driving voltage for the core circuit 12, at the operation of the core circuit 12. The operation speed (frequency) of the core circuit 12 increases in accordance with improvement of the semiconductor device. FIG. 5 exemplarily illustrates one core circuit 12. However, to improve the performance of the semiconductor chip 10, one semiconductor chip 10 has a plurality of (many) core circuits 12 each of which operates at high speed. In this case, it is necessary to supply electric power at an appropriate timing necessarily and sufficiently for electric power demand which dramatically changes in accordance with the operation of the core circuits 12. The driving voltage tends to decrease, in accordance with a request for a reduction in consumption power. This reduces a variation in the voltage to be supplied, and very small noise which is negligible at a slow operation may exert an influence on the operation of the core circuit 12.

Particularly, when the arrangement density of the electrodes 1PD is very high on the surface 10t of the semiconductor chip 10, a pitch between the adjacent electrodes 1PD is narrow. In this case, the cross sectional area of the conductive path for supplying electric power to the electrode 1PD is small in the vicinity of the electrode 1PD, thus increasing the wiring resistance in a part where the cross section area of the path is narrow. When the electrodes 1PDv are coupled with each other through the internal wiring of the semiconductor chip 10, a plurality of power supplying paths are reinforced, and the cross sectional area of the path can be larger on the circuit. However, the internal wiring of the semiconductor chip 10 is narrower and thinner than the wiring of the wiring substrate 20. Thus, if the wiring resistance in the wiring substrate 20 (see FIG. 5) is high, noise is generated before reaching the semiconductor chip 10. It is difficult to perform noise control only with the internal wiring of the semiconductor chip 10.

The arrangement pattern of the electrodes 1PDv and the 1PDg illustrated in FIG. 6 is a layout for enabling to stably supply electric power to the core circuit 12 (see FIG. 5) by improving the wiring layout of the wiring substrate illustrated in FIG. 4.

From the viewpoint of stably supplying electric power to the core circuit 12 (see FIG. 5), the following points are particularly effective, when improving the wiring substrate 20.

That is, on the wiring substrate 20, there are formed a plurality of conductive paths coupled to the electrodes 1PDv (and the electrodes 1PDg) of the semiconductor chip 10. In other words, on the wiring layers (particularly, the wiring layer of the uppermost layer) of the wiring substrate 20, charges are facilitated to move in the horizontal direction (extending direction of the wiring layer). As a result, when the power demand is momentarily increased in a particular electrode 1PDv, it is possible to supply a necessary potential at an appropriate timing to a corresponding electrode 1PDv through the conductive paths. By forming the plurality of conductive paths coupled to one electrode 1PDv, the cross sectional area of the conductive path in the circuit can be increased, thereby enabling to reduce the wiring resistance.

The path distance of each of the conductive paths is reduced. In this case, the conductive paths are coupled to the electrodes 1PDv (and the electrodes 1PDg) of the semiconductor chip 10. The power source potential VD and the reference potential VG illustrated in FIG. 5 are supplied from the side of the wiring layer WL6 of the wiring substrate 20 illustrated in FIG. 4. Thus, of the via wirings 2v and the through hole wirings 2TW for electrically coupling the wiring layers with each other, the wiring that is to supply the power source potential VD or the reference potential VG is arranged in a position overlapping with the electrodes 1PDv and the electrodes 1PDg illustrated in FIG. 6. Particularly, to the wiring layers WL1, WL2, and WL3 illustrated in FIG. 4, many wirings are coupled in a region overlapping with the semiconductor chip 10. Therefore, the through hole wirings 2TW for supplying the power source potential VD or the reference potential VG are preferably arranged in positions overlapping with the electrodes 1PDv and the electrodes 1PDg illustrated in FIG. 6. Of the via wirings 2v between the wiring layer WL1 and the wiring layer WL illustrated in FIG. 4, the via wirings 2v for supplying the power source potential VD or the reference potential VG are preferably arranged in position overlapping with the electrodes 1PDv and the electrodes 1PDg illustrated in FIG. 6. Then, the charges can linearly be moved along the thickness direction (the direction "Z" of FIG. 4) of the wiring substrate 20. As a result, it is possible to reduce the path direction of each of the conductive paths. If the path direction of the conductive path is shortened, thereby enabling to reduce the impedance of the conductive path.

The driving voltage of the core circuit 12 illustrated in FIG. 5 is regulated by the potential difference between the power source potential VD and the reference potential VG. Thus, the electrodes 1PDv and the electrodes 1PDg are preferably arranged in the vicinity of each of the core circuits 12. Therefore, a group of electrodes 1PDv and a group of electrodes 1PDg are preferably dispersed in well balance (for example, alternately), rather than locally gathered and arranged.

In the example illustrated in FIG. 6, the electrodes 1PD included in the semiconductor chip 10 are arranged as follows. That is, the semiconductor chip 10 has, in plan view, a group of power source potential electrodes in which the electrodes 1PDv are arranged in the direction "X" and a group of reference potential electrodes in which the electrodes 1PDg are arranged in the direction "X". The group of power source potential electrodes and the group of reference potential electrodes include a plurality of rows thereof, and are arranged alternately along the direction "Y" in plan view. In this arrangement method, the electrodes 1PDv are arranged adjacent to one or more electrodes 1PDg. In other words, the semiconductor chip 10 has plural pairs of the electrodes 1PDv and the electrodes 1PDg which are adjacent to each other. In the plural pairs, the separation distance between the adjacent electrodes 1PDv and the electrodes 1PDg is an equal distance. It can be said that, in the arrangement of the electrodes 1PD illustrated in FIG. 6, the electrodes 1PDv and the electrodes 1PDg are dispersed in well balance.

The semiconductor chip 10 and the wiring substrate 20 are coupled in accordance with the flip-chip coupling system. In the case of the flip-chip coupling system, the arrangement of the terminals 2PD arranged on the wiring layer WL1 of the uppermost layer of the wiring substrate 20 as illustrated in FIG. 4 is the same as the arrangement of the electrodes 1PD of the semiconductor chip 10. Thus, in the wiring layer WL1, the terminals 2PDv (see FIG. 5) and the terminals 2PDg are preferably dispersed in well balance (for example, alternately). In this manner, when different kinds of terminals 2PD are dispersed and arranged, the wiring width of the wiring provided at least on the wiring layer WL1 of the uppermost layer needs to be narrower than the conductor pattern of the wiring provided on another wiring layer.

Based on the above examination result, on the wiring substrate 20, in the structure of the wiring for supplying the power source potential VD (see FIG. 5) or the reference potential VG (see FIG. 5), it is preferred that the charges are facilitated to move in the direction along each of the wiring layers of the wiring substrate 20, and it is also preferred that there is a short path distance of a plurality of paths for supplying electric power through the wiring layers. The wiring around the terminals 2PD formed on at least the wiring layer WL1 of the uppermost layer has a narrow wiring width as described above. Thus, on the wiring substrate 20, the wiring paths for supplying the power source potential VD or the reference potential VG form a three-dimensional mesh structure. Thus, it is necessary to suppress an increase in the wiring resistance of the wiring layer WL1.

<Details of Wiring Layout>

Figure 7:
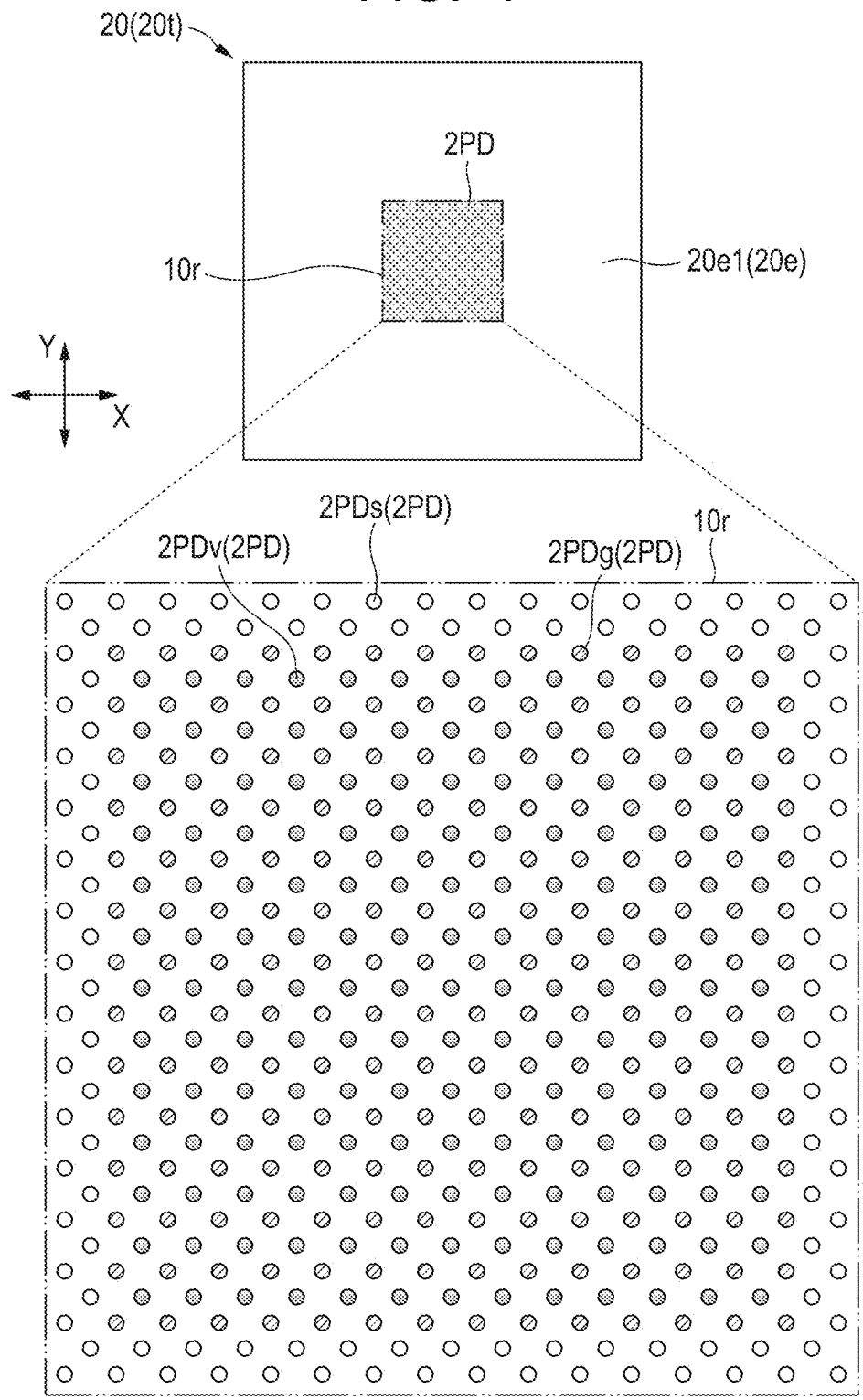
FIG. 7 is a plan view illustrating a state in which the semiconductor chip and an underfilling resin are excluded, on the upper surface of a wiring substrate illustrated in FIG. 3.
Figure 8:
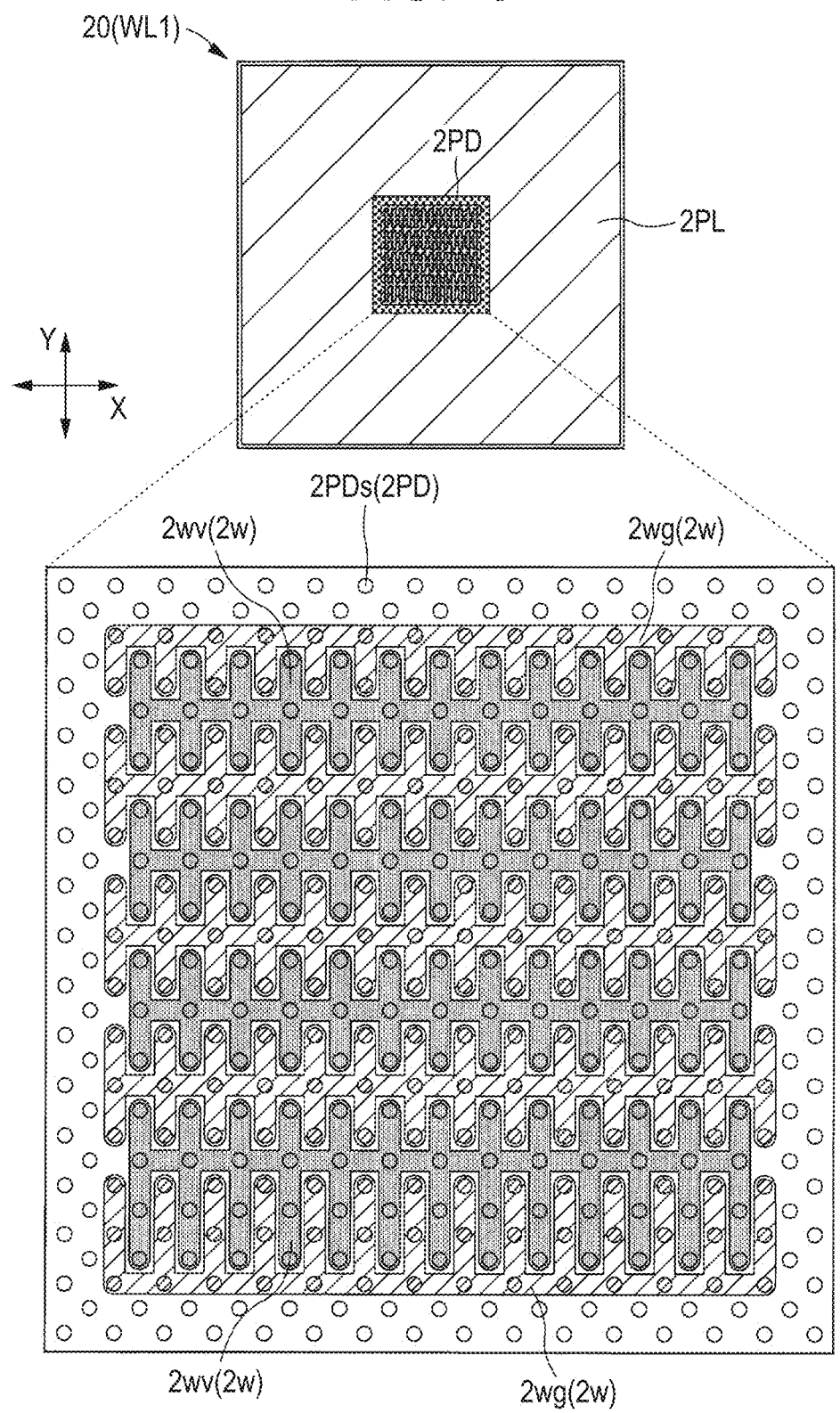
FIG. 8 is a plan view illustrating a layout example of a wiring layer as the first layer, excluding an insulating film of the uppermost layer, on the wiring substrate of FIG. 7.
Figure 9:
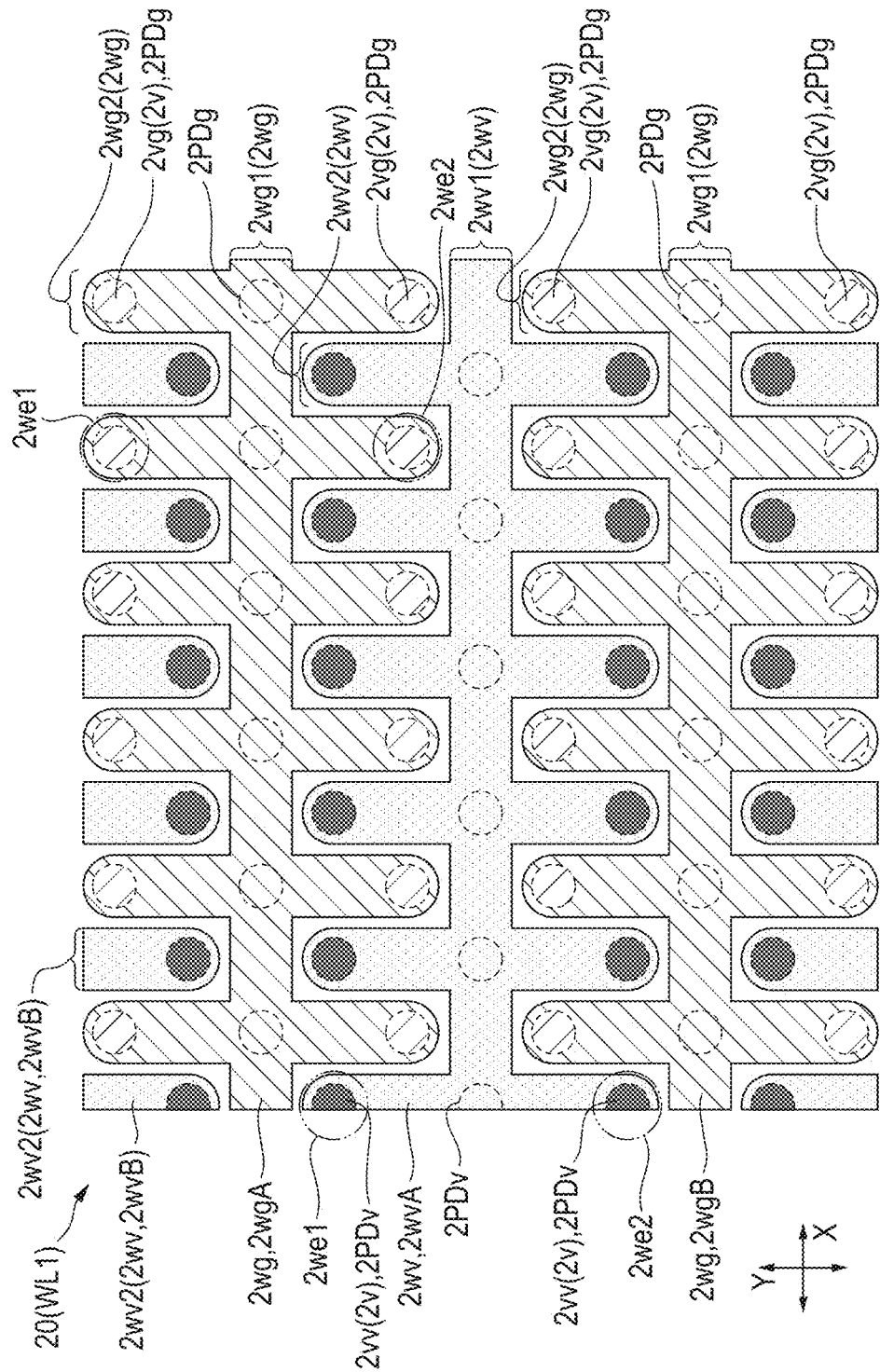
FIG. 9 is an enlarged plan view illustrating an enlarged center part of FIG. 8.
Figure 11:
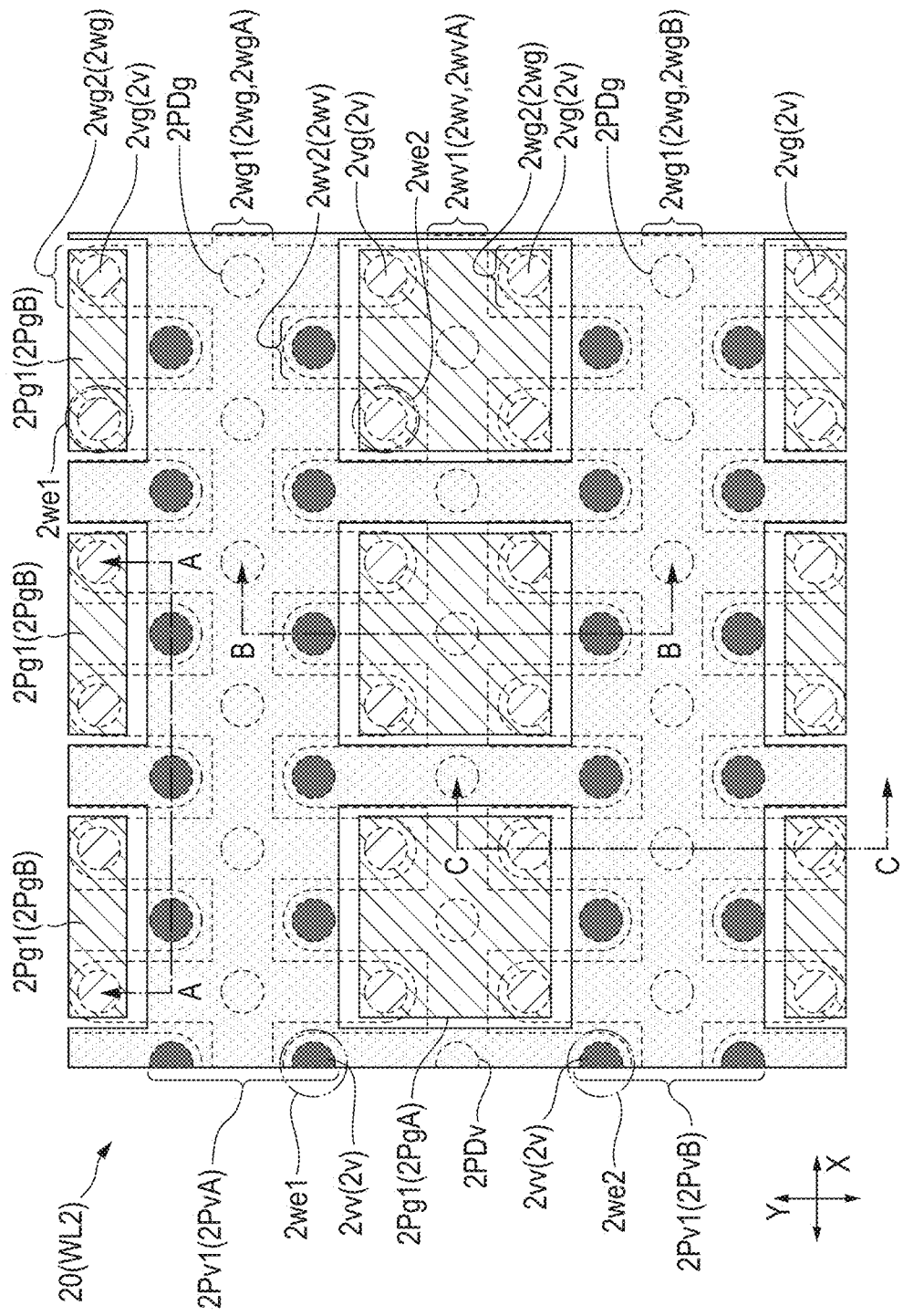
FIG. 11 is an enlarged plan view illustrating an enlarged center part overlapping the plane surface illustrated in FIG. 9, of the wiring layer of FIG. 10.

Descriptions will now specifically be made to a wiring layout on each wiring layer included in the wiring substrate 20 illustrated in FIG. 4, using the illustration. FIG. 7 is a plan view illustrating a state in which the semiconductor chip and an underfilling resin are excluded, on the upper surface of the wiring substrate illustrated in FIG. 3. FIG. 8 is a plan view illustrating a layout example of a wiring layer as the first layer, excluding an insulating film of the uppermost layer, on the wiring substrate of FIG. 7. FIG. 7 and FIG. 8 illustrate an enlarged region overlapping with the chip-mounting region illustrated in FIG. 7. FIG. 9 is an enlarged plan view illustrating an enlarged center part of FIG. 8. FIG. 9 illustrates a further enlarged part of the enlarged view of FIG. 8. FIG. 10 is a plan view illustrating a layout example of a wiring layer as the second layer, on the wiring substrate of FIG. 7. FIG. 11 is an enlarged plan view illustrating an enlarged center part overlapping with the plane surface illustrated in FIG. 9, of the wiring layer of FIG. 10. Though FIG. 7 to FIG. 11 are plan views, to identify the signal transmission path, the path for supplying a power source potential, and a path for supplying a reference potential, they are illustrated with the same patterns as those of FIG. 6. That is, in FIG. 7 to FIG. 11, the signal transmission paths are in blank, the paths for supplying a power source potential are illustrated in a dot pattern, and the paths for supplying a reference potential are illustrated in a hatching pattern. In FIG. 9 and FIG. 11, the positions of the terminals 2PD of the wiring substrate 20 (in other words, the positions overlapping with the electrodes 1PD of the semiconductor chip 10 of FIG. 6) are illustrated in a dotted line. In FIG. 9 and FIG. 11, positions of via wirings 2vv right below a wiring 2wv are illustrated in a dot pattern thicker than that of the surrounding. In FIG. 9 and FIG. 11, positions of via wirings 2vg right below a wiring 2wg are illustrated in a hatching pattern opposed to that of the surrounding. In FIG. 11, the outlines of the wiring 2wv and the wiring 2wg illustrated in FIG. 9 are illustrated in a dotted line.

Figure 12:
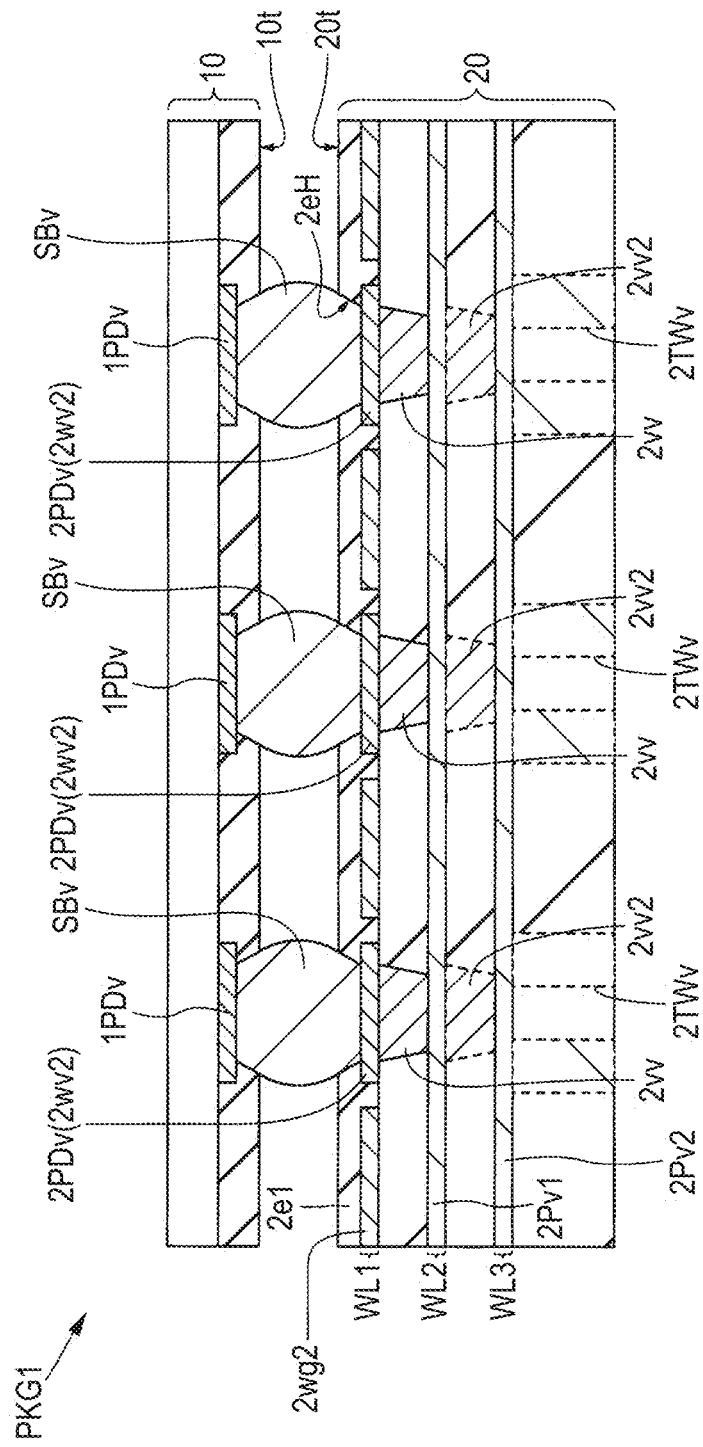
FIG. 12 is an enlarged cross sectional view of a line A-A of FIG. 11.
Figure 13:
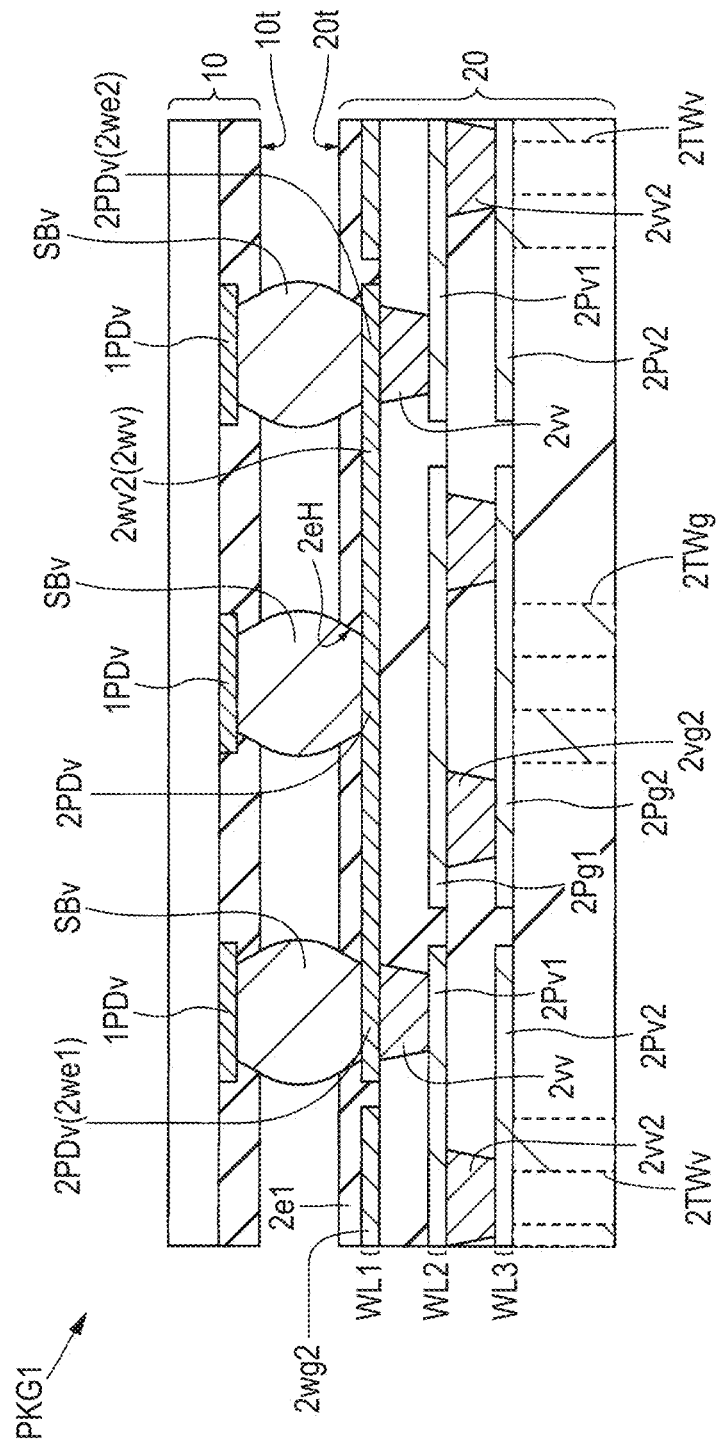
FIG. 13 is an enlarged cross sectional view of a line B-B of FIG. 11.
Figure 14:
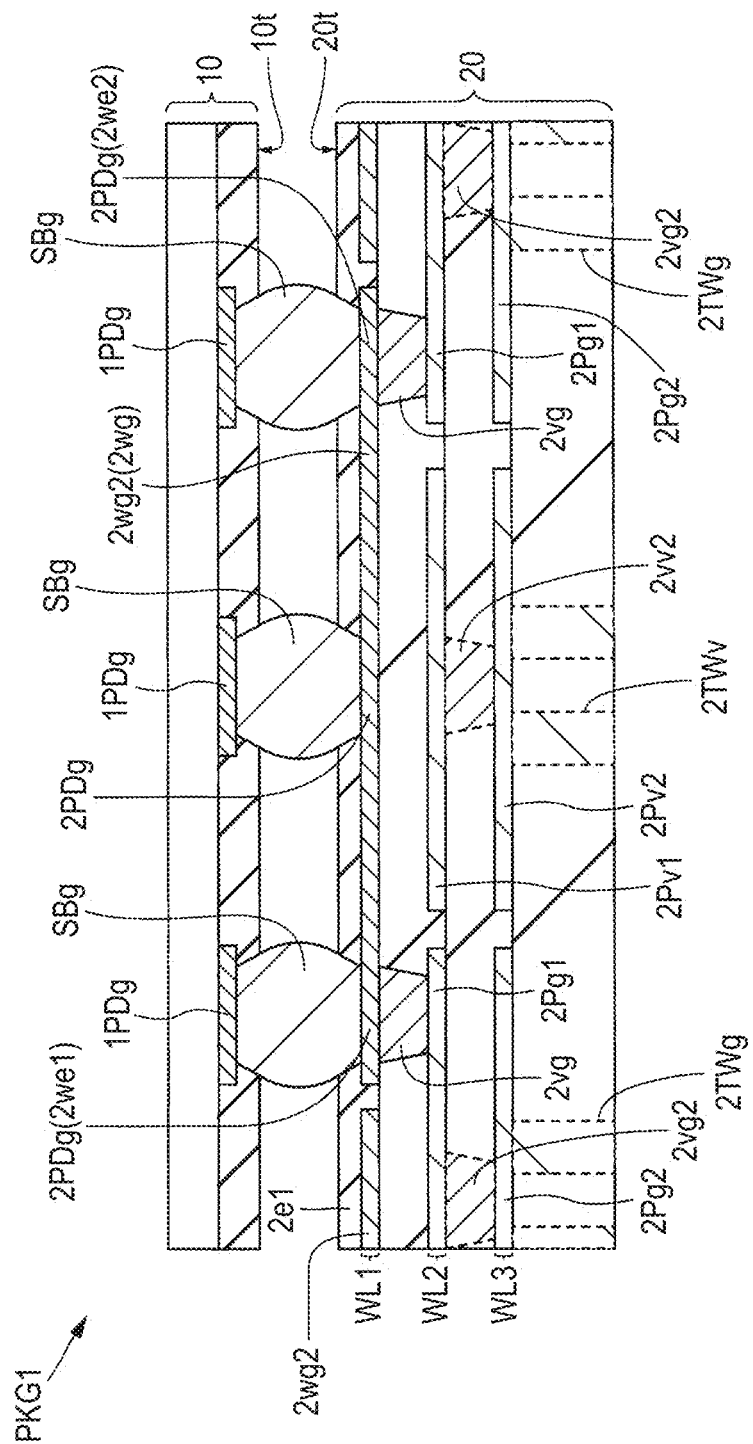
FIG. 14 is an enlarged cross sectional view of a line C-C of FIG. 11.

FIG. 12 is an enlarged cross sectional view of a line A-A of FIG. 11. FIG. 13 is an enlarged cross sectional view of a line B-B of FIG. 11. FIG. 14 is an enlarged cross sectional view of a line C-C of FIG. 11. FIG. 12 to FIG. 14 illustrate the wiring layer upper than the core insulating film, of a part of the surface 10t side and the wiring substrate of the semiconductor chip. FIG. 12 to FIG. 14 illustrate via wirings or through hole wirings in positions different from those in cross section in dotted lines, for clear illustration of the coupling relationship from the wiring layer WL1 to the through hole wiring.

As obvious from a comparison between FIG. 7 and FIG. 8, the wiring layer WL1 as the uppermost layer of the wiring substrate 20 is mostly covered by an insulating film 2e1. The insulating film 2e1 is a solder resist film which covers the upper surface 20t side of the wiring substrate 20. The insulating film 2e1 has a plurality of openings provided therein. The conductor pattern in the lower layer of the insulating film 2e1 is partially exposed from the openings. The part exposed from the insulating film 2e1 in the openings is the terminal 2PD of the wiring substrate 20.

The terminals 2PD illustrated in FIG. 7 are arranged in positions opposed to the electrodes 1PD of the semiconductor chip 10 illustrated in FIG. 6. In other words, on the upper surface 20t of the wiring substrate 20, the openings are formed in a chip-mounting region 10r as a region overlapping with the semiconductor chip 10 (see FIG. 1). Further, in other words, on the upper surface 20t of the wiring substrate 20, the terminals 2PD are arranged in the chip-mounting region 10r. Thus, the descriptions made to the layout of the electrodes 1PD using FIG. 5 and FIG. 6 can be replaced by the descriptions made to the layout of the terminals 2PD illustrated in FIG. 7. That is, the terminals 2PD of the wiring substrate 20 include terminals 2PDs, terminals 2PDv, and terminals 2PDg.

On the upper surface 20t of the wiring substrate 20, the terminals 2PDs, the terminals 2PDv, and the terminals 2PDg are regularly arranged. The terminals 2PDv and the terminals 2PDg are arranged the most in the center part of the upper surface 20t. The terminals 2PDs are mostly arranged on the outer periphery of the upper surface 20t, that is, in the outer edge and the peripheral part of the center part of the upper surface 20t.

Specifically, the terminals 2PDs are arranged in the outermost periphery and in one inner periphery from the outermost periphery, of the arrangement of the terminals 2PD. On the upper surface 20t of the wiring substrate 20, the terminals 2PDs for transmitting an electrical signal SIG (see FIG. 5) are arranged on the outer peripheral side, thereby enabling to reduce the path distance of the signal transmission path.

The terminals 2PDs are electrically coupled to a plurality of via wirings (via) 2vs arranged on the outer peripheral side of the wiring substrate 20 through a plurality of wirings 2ws provided on the wiring layer WL2 illustrated in FIG. 10. On the wiring layer WL2, a conductor plane 2PL is arranged around the wiring 2ws and the via wiring 2vs. The wiring 2ws and the via wiring 2vs are covered by the conductor plane 2PL formed on the wiring layer WL1 illustrated in FIG. 8. The via wirings 2vs are electrically coupled to through hole wirings 2TWs for signal transmission in FIG. 4. The through hole wirings 2TWs are arranged in positions (the surrounding region of the wiring substrate 20) not overlapping with the semiconductor chip 10.

The terminals 2PDv and the terminals 2PDg are arranged inside the terminals 2PDs on the upper surface 20t. In other words, the terminals 2PDs are arranged between the terminals 2PDv, the terminals 2PDg, and the outer edge of the upper surface 20t. As illustrated in FIG. 1, in a state where the semiconductor chip 10 is mounted on the wiring substrate 20 as illustrated in FIG. 1, the core circuit 12 (see FIG. 5) overlaps with a part in which the terminals 2PDv and the terminals 2PDg are arranged. As illustrated in FIG. 4, the electrodes 1PD of the semiconductor chip 10 and the terminals 2PD of the wiring substrate 20 are coupled with each other through the bump electrodes SB. Thus, the terminals 2PDv and the terminals 2PDg overlap with the core circuit 12, thereby reducing the path for supplying a power source for the core circuit 12. This results in reducing power loss or noise when supplying electric power to the core circuit 12.

In the example illustrated in FIG. 7, of the arrangement of the terminals 2PD on the upper surface 20t, the terminals 2PDv and the terminals 2PDg are not arranged in the outermost periphery and in one inner periphery from the outermost periphery. Of the arrangement of the terminals 2PD on the upper surface 20t, the terminals 2PDs are not arranged in two or more inner periphery from the outermost periphery. Like the modification described using FIG. 6, however, various modifications are possible for the arrangement of the terminals 2PD illustrated in FIG. 7.

As illustrated in FIG. 7, the terminals 2PDv and the terminals 2PDg are arranged in the center part of the upper surface 20t, as follows. That is, the terminals 2PDv and the terminals 2PDg are arranged in a row along the direction "X". In the direction crossing the direction "X" (orthogonal to, in FIG. 7), the row of the terminals 2PDv and the row of the terminals 2PDg are alternately arranged. The terminals 2PD are arranged in zigzag. The term "arranged in zigzag" is applicable to the case in which the electrodes 1PD are replaced by the terminals 2PD. Thus, the same descriptions will not be made over and over.

Each of the terminals 2PDv illustrated in FIG. 7 is a part of the wiring (conductor pattern, wiring pattern) 2wv arranged on the wiring layer WL1 as the first layer illustrated in FIG. 8. Similarly, each of the terminals 2PDg illustrated in FIG. 7 is a part of the wiring (conductor pattern, wiring pattern) 2wg arranged on the wiring layer WL1 as the first layer illustrated in FIG. 8. Each of the wirings 2wv and the wirings 2wg is arranged in a position overlapping with the semiconductor chip 10 illustrated in FIG. 1. The wirings 2wv and the wirings 2wg extend in the direction "X", and are arranged alternately in the direction "Y". On the wiring layer WL1, the conductor plane 2PL is arranged around the region overlapping with the semiconductor chip 10 (see FIG. 1). The conductor plane 2PL has an area larger than that of the wiring 2w or the via wiring 2v (see FIG. 9). For example, a ground potential is supplied to the conductor plane 2PL. As illustrated in FIG. 4, in the case of the wiring substrate 20 of the semiconductor device PKG1, the wiring 2ws for signal transmission is arranged on the wiring layer WL2, and overlaps with the conductor plane 2PL provided on the wiring layer WL1. In this manner, when the wiring 2ws for signal transmission is covered by the conductor pattern, with a large area, to which a fixed potential is supplied, electromagnetic noise can be shielded. The wiring (signal wiring) 2ws is pulled out to the outside of the region overlapping with the semiconductor chip 10. Thus, on the wiring layer WL1, the wiring 2ws is mostly covered by the conductor plane 2PL, by arranging the conductor plane 2PL in a region not overlapping with the semiconductor chip 10.

As illustrated in FIG. 8, on the wiring layer WL1, the terminals 2PDs, the wirings 2wg, and the wirings 2wv are arranged in a region overlapping with the semiconductor chip 10 (see FIG. 4). The terminals 2PDs are arranged around a region in which the wirings 2wg and the wiring 2wv are arranged, and are electrically coupled with the wiring layer WL2 through the via wiring (via) 2vs (see FIG. 4) for signal transmission.

As illustrated in FIG. 9, the wirings 2wv have a main wiring unit (first main wiring unit) 2wv1 extending in the direction "X" and a plurality of sub-wiring units (first sub-wiring units) 2wv2 extending in the direction "Y" crossing the direction "X" and crossing the main wiring unit 2wv1. To the wirings 2wv, a power source potential VD illustrated in FIG. 5 is supplied.

As illustrated in FIG. 9, the wirings 2wg have a main wiring unit (second main wiring unit) 2wg1 extending in the direction "X" and a plurality of sub-wiring units (second sub-wiring units) 2wg2 extending in the direction "Y" crossing the direction "X" and crossing the main wiring unit 2wg1. To the wirings 2wg, a reference potential VG illustrated in FIG. 5 is supplied.

Each of the sub-wiring units 2wv2 of the wiring 2wv and the sub-wiring units 2wg2 of the wiring 2wg has an end unit (first end unit) 2we1 and an end unit (second end unit) 2we2, in the direction "Y", on the side opposed to the end unit 2we1 through the main wiring unit 2wv1 or the main wiring unit 2wg1. The sub-wiring units 2wv2 of the wiring 2wv and the sub-wiring units 2wg2 of the wiring 2wg are alternately arranged in the direction "X", between the main wiring unit 2wv1 and the main wiring unit 2wg1.

As illustrated in FIG. 11, the wiring layer WL2 has a conductor pattern (first conductor pattern) 2Pv1, overlapping with the main wiring unit 2wg1 of the wiring 2wg and the end unit 2we1 of the sub-wiring unit 2wv2 of the wiring 2wv, and extending in the direction "X". The wiring layer WL2 has a conductor pattern 2Pg1, overlapping with the main wiring unit 2wv1 of the wiring 2wv and the end units of 2we2 the sub-wiring units 2wg2 of the wiring 2wg. In the example illustrated in FIG. 11, the wiring layer WL2 has a plurality of conductor patterns (second conductor patterns) 2Pg1 arranged in the direction "X". The end units 2we1 of the sub-wiring units 2wv2 are electrically coupled to the conductor pattern 2Pv1 through the via wirings (first via) 2vv. The end units 2we2 of the sub-wiring units 2wg2 are electrically coupled to the conductor patterns 2Pg1 through the via wirings (second via) 2vg.

In the semiconductor device PKG1 of this embodiment, the wiring path for supplying a power source potential VD (see FIG. 5) and the wiring path for supplying a reference voltage VG (see FIG. 5) are configured as described above, thereby enabling to stably supply electric power to the core circuit 12 (see FIG. 5).

Each of the wirings 2wv and the wirings 2wg illustrated in FIG. 9 has one main wiring unit (2wv1 or 2wg1) extending in the direction "X" and the sub-wiring units (2wv2 or 2wg2) extending in the direction "Y". Each of the sub-wiring units is arranged across the main wiring unit. Both ends of the sub-wiring units are coupled to the conductor patterns (2Pv1 or 2Pg1) of the wiring layer WL2 illustrated in FIG. 11. As a result, when the electric power demand has momentarily increased in one part of, for example, the wiring 2wv, a power source potential VD is supplied from the end unit of the sub-wiring unit 2wv2 of the wiring 2wv. Similarly, when the electric power demand has momentarily increased in one part of, for example, the wiring 2wg, a reference potential VG is supplied from the end unit of the sub-wiring unit 2wg2 of the wiring 2wg. In this manner, according to the wiring structure of the semiconductor device PKG1, there are formed a plurality of conductive paths for supplying the potential to each of the wiring 2wv and the wiring 2wg. Therefore, in the wiring 2wv and the wiring 2wg, charges are facilitated to move in the direction along the wiring layer WL1. As a result, even when the main wiring unit and the sub-wiring units of the wiring 2wv and the wiring 2wg have a narrow wiring width, it is possible to suppress an increase in the wiring resistance.

The sub-wiring units 2wv2 of the wiring 2wv and the sub-wiring units 2wg2 of the wiring 2wg are arranged alternately in the direction "X" between the main wiring unit 2wv1 and the main wiring unit 2wg1. In this case, it is possible to reduce the separation distance between the sub-wiring units 2wv2 of the wiring 2wv and the sub-wiring units 2wg2 of the wiring 2wg. Thus, when the terminal 2PDv is provided in plural parts of the wiring 2wv, and when the terminal 2PDg is provided in plural parts of the wiring 2wg, the terminals 2PDv and the terminals 2PDg are dispersed in well balance (for example, alternately).

In the example illustrated in FIG. 7, the terminals 2PD included in the wiring substrate 20 are arranged as follows. That is, the wiring substrate 20 has, in plan view, a group of power source potential terminals in which the terminals 2PDv are arranged in the direction "X" and a group of reference potential terminals in which the terminals 2PDg are arranged in the direction "X". The group of power source potential terminals and the group of reference potential terminals include a plurality of rows thereof, and are arranged alternately along the direction "Y", in plan view. In the case of this arrangement method, the terminals 2PDv are arranged adjacent to one or more terminals 2PDg. The terminals 2PDg are arranged adjacent to one or more terminals 2PDv. In other words, the wiring substrate 20 has plural pairs of the adjacent terminals 2PDv and the terminals 2PDg. In the plural pairs of terminals, the separation distance between the adjacent terminals 2PDv and the terminals 2PDg is an equal distance. In the arrangement of the terminals 2PD illustrated in FIG. 7, the terminals 2PDv and the terminals 2PDg are dispersed in well balance.

The sub-wiring units 2wv2 and the sub-wiring units 2wg2 illustrated in FIG. 9 are alternately arranged, thereby enabling to reduce the parasitic inductance generated in the sub-wiring units 2wv2 of the wiring 2wv and the sub-wiring units 2wg2 of the wiring 2wg. As a result, it is possible to reduce noise generated in the wiring 2wv and the wiring 2wg.

As illustrated in FIG. 8 and FIG. 9, the wiring layer WL1 has the wirings 2wv and the wirings 2wg. In plan view, the wirings 2wv and the wirings 2wg extend in the direction "X" (the main wiring unit extends in the direction "X"), and are arranged alternately along the direction "Y".

Focusing on the wiring 2wg, the following descriptions can be made. That is, as illustrated in FIG. 9, the wiring layer WL1 has a wiring (second wiring) 2wgA and a wiring (third wiring) 2wgB to which a reference potential VG (see FIG. 5). Each of the wiring 2wgA and the wiring 2wgB has the main wiring unit 2wg1 extending in the direction "X", in plan view, and the sub-wiring units 2wg2 extending in the direction "Y" and crossing the main wiring unit 2wg1. The wiring 2wvA is arranged between the wiring 2wgA and the wiring 2wgB, in the direction "Y". The sub-wiring units 2wv2 of the wiring 2wvA and the sub-wiring units 2wg2 of the wiring 2wgB are alternately arranged in the direction "X", between the main wiring unit 2wv1 and the main wiring unit 2wg1. As illustrated in FIG. 11, the wiring layer WL2 has a conductor pattern 2PvB, overlapping with the main wiring unit 2wg1 of the wiring 2wgB and the end units 2we2 of the sub-wiring units 2wv2 of the wiring 2wvA. The end units 2we2 of the sub-wiring units 2wv2 of the wiring 2wvA are electrically coupled with the conductor pattern 2PvB through the via wirings 2vv, while the end units 2we1 of the sub-wiring units 2wg2 of the wiring 2wvA are electrically coupled with the conductor pattern 2PvA through the via wirings 2vg.

Focusing on the wiring 2wv, the following descriptions can be made. As illustrated in FIG. 9, the wiring layer WL1 has the wiring (first wiring) 2wvA and a wiring (fourth wiring) 2wvB to which the power source voltage VD (see FIG. 5) is supplied. Each of the wiring 2wvA and the wiring 2wvB has the main wiring unit 2wv1 extending in the direction "X" and the sub-wiring units 2wv2 extending in the direction "Y" and crossing the main wiring unit 2wv1, in plan view. The wiring 2wgA is arranged between the wiring 2wvA and the wiring 2wvB in the direction "Y". The sub-wiring units 2wg2 of the wiring 2wgA and the sub-wiring units 2wv2 of the wiring 2wvB are alternately arranged in the direction "X" between the main wiring unit 2wg1 and the main wiring unit 2wv1 (FIG. 9 does not illustrate the main wiring unit 2wv1 of the wiring 2wvB). As illustrated in FIG. 11, the wiring layer WL2 has a conductor pattern 2PgB, overlapping with the main wiring unit 2wv1 (not illustrated in FIG. 11) and the end units 2we1 of the sub-wiring units 2wg2 of the wiring 2wgA. The end units 2we1 of the sub-wiring units 2wg2 of the wiring 2wgA are electrically coupled with the conductor pattern 2PgB through the via wirings 2vg, while the end units 2we2 of the sub-wiring units 2wg2 of the wiring 2wgA are electrically coupled with the conductor pattern 2PgA through the via wirings 2vg.

In the case of the semiconductor device PKG1, the semiconductor chip 10 and the wiring substrate 20 are electrically coupled using a flip-chip coupling system. As illustrated in FIG. 12 and FIG. 13, the surface 10t of the semiconductor chip 10 is opposed to the upper surface 20t of the wiring substrate 20. The electrodes 1PD (see FIG. 4) of the semiconductor chip 10 include a plurality of electrodes 1PDv electrically coupled to the wirings 2wv of the wiring substrate 20 (see FIG. 9) and a plurality of electrodes 1PDg electrically coupled to the wirings 2wg of the wiring substrate 20 (see FIG. 9). The wiring substrate 20 has a plurality of terminals 2PDv opposed to and electrically coupled with the electrodes 1PDv of the semiconductor chip 10 and a plurality of terminals 2PDg opposed to and electrically coupled to the electrodes 1PDg of the semiconductor chip 10. Accordingly, by applying the flip-chip coupling system, the conductive path for electrically coupling the semiconductor chip 10 and the wiring substrate 20 can be shortened. This results in reducing the impedance of the conductive path.

In the case of the semiconductor device PKG1, the terminals 2PD of the wiring substrate 20 are formed on the same layer as the wiring layer WL1 on which the wiring 2wv and the wiring 2wg, as illustrated in FIG. 9, are formed. In other words, as illustrated in FIG. 12, the wiring substrate 20 has an insulating film 2e1, which covers the wiring layer WL1 and includes a plurality of openings 2eH. The wiring 2wv (see FIG. 9) has a plurality of terminals 2PDv exposed from the insulating film 2e1, in the openings 2eH of the insulating film 2e1. The wiring 2wg (see FIG. 9) has a plurality of terminals 2PDg exposed from the insulating film 2e1, in the openings 2eH of the insulating film 2e1. The electrodes 1PDv and the terminals 2PDv of the semiconductor chip 10 are coupled with each other through the bump electrodes SBv. The electrodes 1PDg and the terminals 2PDg of the semiconductor chip 10 are coupled through the bump electrodes SBg (see FIG. 14). Accordingly, it is possible to shorten the path for supplying a power source potential, when a part of the wiring 2wv functions as the terminal 2PDv. It is also possible to shorten the path for supplying a reference potential, when a part of the wiring 2wg functions as the terminal 2PDg.

As illustrated in FIG. 9, apart of the terminals 2PDv forming a part of the wiring 2wv is included in the end unit of each of the sub-wiring units 2wv2. Apart of the terminals 2PDg forming a part of the wiring 2wg is included in the end unit of each of the sub-wiring units 2wg2. In other words, the terminals 2PDv include a plurality of terminals 2PDv included in the end units (first end unit) 2we1 and in the end units (second end units) 2we2 of the sub-wiring units 2wv2. The terminals 2PDg include a plurality of terminals 2PDg included in the end units 2we1 and in the end units 2we2 of the sub-wiring units 2wg2. In this manner, the end units of the sub-wiring units 2wv2 and 2wg2 crossing the main wiring units 2wv1 and 2wg1 are made to function as the terminals 2PDv and 2PDg, thereby distributing the paths for supplying a power source potential and the paths for supplying a reference potential in well balance.

As illustrated in FIG. 13, the terminals 2PDv in the end unit 2we1 and the end unit 2we2 overlap with the via wirings 2vv. As illustrated in FIG. 14, the terminals 2PDg of the end unit 2we1 and the end unit 2we2 overlap with the via wirings 2vg. In this manner, it is possible to shorten the path for supplying a power source potential in the thickness direction of the wiring substrate 20, if the terminals 2PDv overlap with the via wirings 2vv. Similarly, it is also possible to shorten the path for supplying a reference potential in the thickness direction of the wiring substrate 20, if the terminals 2PDg overlap with the via wirings 2vg.

In the case of the semiconductor device PKG1, as illustrated in FIG. 9, a part of the terminals 2PDv forming a part of the wiring 2wv is included in the main wiring unit 2wv1. Apart of the terminals 2PDg forming apart of the wiring 2wg is included in the main wiring unit 2wg1. In other words, the terminals 2PDv include the terminals 2PDv in the main wiring unit 2wv1. The terminals 2PDg include the terminals 2PDv in the main wiring unit 2wg1. Accordingly, it is possible to form a plurality of paths for supplying a power source potential and a plurality of paths for supplying a reference potential, by providing the terminals 2PDv and 2PDg not only in the end units of the sub-wiring units 2wv2 and 2wg2, but also in the main wiring units 2wv1 and 2wg1.

As illustrated in FIG. 11, the main wiring unit 2wv1 of the wiring 2wv (see FIG. 13) overlaps with the conductor pattern 1Pg1 of the wiring layer WL2. The main wiring unit 2wg1 of the wiring 2wg (see FIG. 14) overlaps with the conductor pattern 2Pv1 of the wiring layer WL2. Thus, as illustrated in FIG. 13, of the terminals 2PDv, the terminal 2PDv in the main wiring unit 2wv1 (see FIG. 11) does not overlap with the via wiring 2vv. As illustrated in FIG. 14, of the terminals 2PDg, the terminal 2PDg in the main wiring unit 2wg1 (see FIG. 11) does not overlap with the via wiring 2vg.

Figure 15:
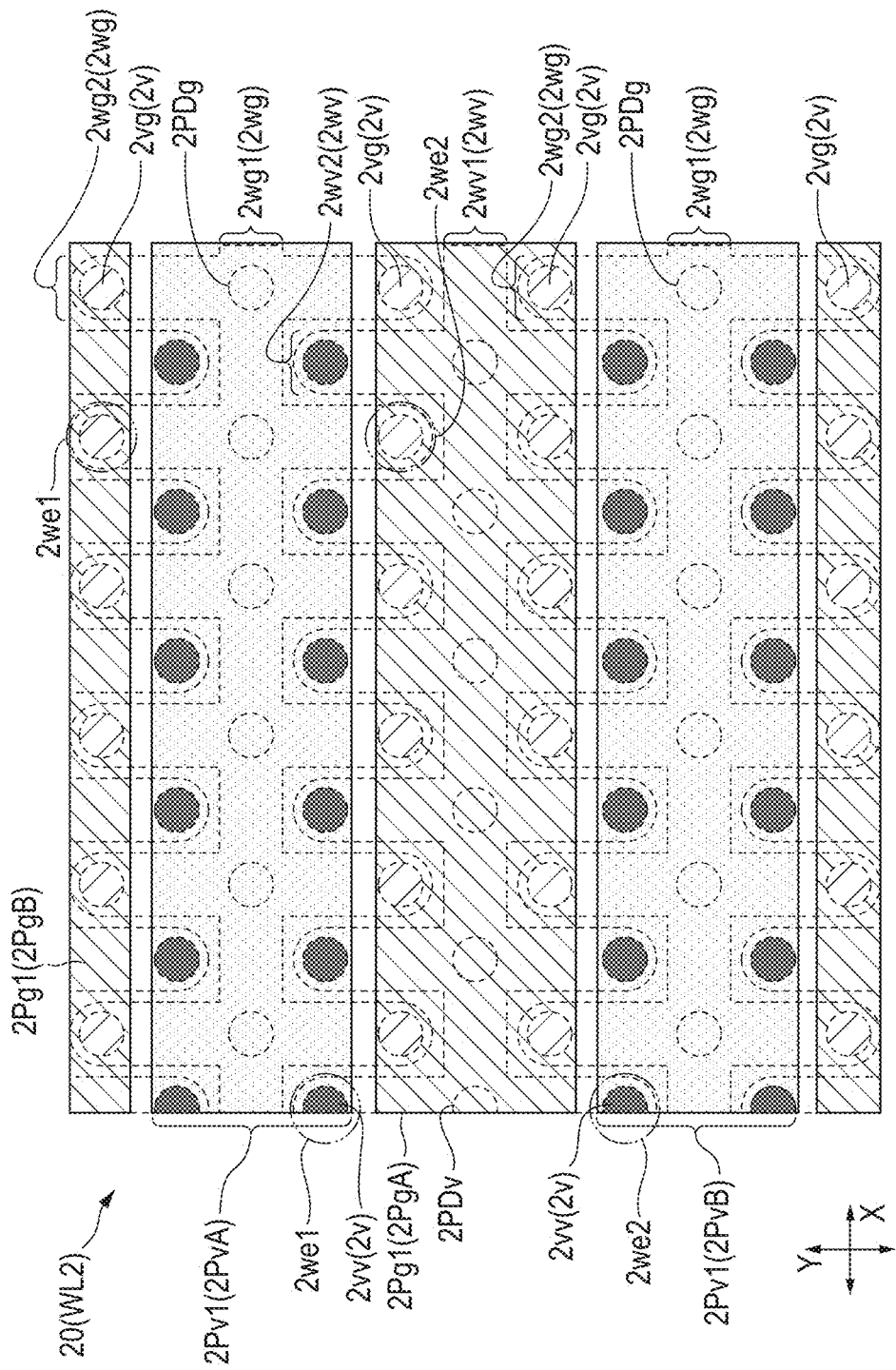
FIG. 15 is an enlarged plan view illustrating a modification of FIG. 11.

The wiring layer WL2 has a plurality of conductor patterns for supplying a power source and a plurality of conductor patterns for supplying a reference potential. FIG. 15 is an enlarged plan view illustrating a modification of FIG. 11. As illustrated in FIG. 11, the wiring layer WL2 has a conductor pattern (part) 2PvA overlapping with the end unit 2we1 of the sub-wiring units 2wv2 and extending in the direction "X" and a conductor pattern (part) 2PvB overlapping with the end unit 2we2 of the sub-wiring units 2wv2 and extending in the direction "X". In plan view, the conductor pattern 2PgA (a plurality of conductor patterns 2PgA) is arranged between the conductor pattern 2PvA and the conductor pattern 2PvB. The end units 2we2 of the sub-wiring units 2wv2 are electrically coupled to the conductor pattern 2PvB through the via wirings 2vv. In other words, the conductor pattern 2PvA and the conductor pattern 2PvB are electrically coupled with each other through the sub-wiring units 2wv2.

As illustrated in FIG. 15, in a modification of this embodiment, the conductor pattern 2PvA and the conductor pattern 2PvB are separated from each other. In this case, the conductor pattern 2PgA between the conductor pattern 2PvA and the conductor pattern 2PvB is formed to extend in the direction "X". In this modification, on the wiring layer WL2, a plurality of conductor patterns 2Pv1 and a plurality of conductor pattern 2Pg1 are separated from each other. In the modification illustrated in FIG. 15, the conductor pattern 2PvA and the conductor pattern 2PvB are electrically coupled with each other through the sub-wiring units 2wv2, thereby enabling to increase the number of paths for supplying a power source potential.

As illustrated in FIG. 15, the wiring layer WL2 has the conductor pattern 2PgA and the conductor pattern 2PgB. The conductor pattern 2PgA overlaps with the end unit 2we2 of the sub-wiring units 2wg2, and extends in the direction "X". The conductor pattern 2PgB overlaps with the end unit 2we1 of the sub-wiring units 2wg2, and extends in the direction "X". The conductor pattern 2PvA is provided between the conductor pattern 2PgA and the conductor pattern 2PgB, in plan view. The end units 2we1 of the sub-wiring units 2weg2 are electrically coupled to the conductor pattern 2PgB through the via wirings 2vg, while the end units 2we2 are electrically coupled to the conductor pattern 2PgA through the via wirings 2vg. In other words, the conductor pattern 2PgA and the conductor pattern 2PgB are electrically coupled through the sub-wiring units 2wg2. In the case of the modification illustrated in FIG. 15, the conductor pattern 2PgA and the conductor pattern 2PgB are electrically coupled with each other through the sub-wiring units 2wg2, thereby enabling to increase the number of paths for supplying a reference potential.

Figure 16:
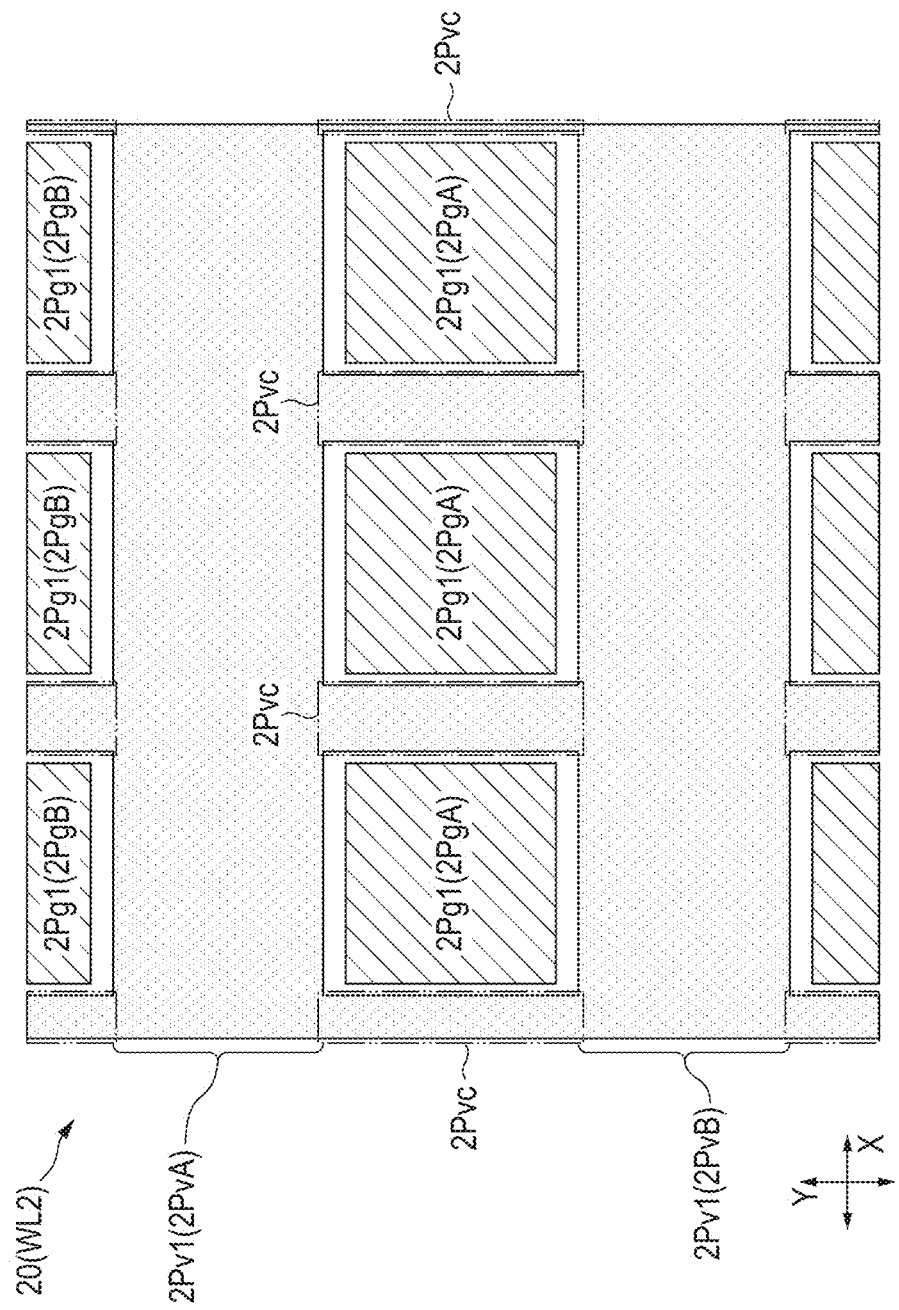
FIG. 16 is an enlarged plan view illustrating only a conductor pattern for supplying a power source illustrated in FIG. 11 and a conductor pattern for supplying a reference potential.

In the example of FIG. 11, the wiring layer WL2 has the conductor pattern 2PgA and the conductor pattern 2PgB. The conductor pattern 2PgA overlaps with the end units 2we2 of the sub-wiring units 2wg2, and is arranged in the direction "X". The conductor pattern 2PgB overlaps with the end units 2we1 of the sub-wiring units 2wg2, and is arranged in the direction "X". As illustrated in FIG. 11, when the conductor patters 2Pg1 separated from each other in the direction "X" are arranged, electrical coupling is made with the conductor patterns 2Pg1 through the wiring 2wg provided on the wiring layer WL1 (see FIG. 9), thereby enabling to increase the number of paths for supplying a reference potential. FIG. 16 is an enlarged plan view illustrating only a conductor pattern for supplying a power source illustrated in FIG. 11 and a conductor pattern for supplying a reference potential. As illustrated in FIG. 16, the wiring layer WL2 has the conductor patterns 2PgA, which are arranged between the conductor pattern 2PvA and the conductor pattern 2PvB in the direction "Y" and are arranged in one row in the direction "X". The conductor pattern 2PvA and the conductor pattern 2PvB are electrically coupled through a connecting unit 2Pvc provided between the conductor patterns 2PgA. In this manner, in the case of the example illustrated in FIG. 11 and FIG. 16, the conductor patterns 2PgA are divided into groups of a few patterns, in the direction "X" of the wiring layer WL2. This results in arranging the connecting unit 2Pvc for the adjacent conductor pattern 2PgA. As illustrated in FIG. 16, the conductor pattern 2PvA and the conductor pattern 2PvB are coupled through a plurality of connecting units 2Pvc. Then, it is possible to further increase the number of paths for supplying a reference potential.

Figure 17:
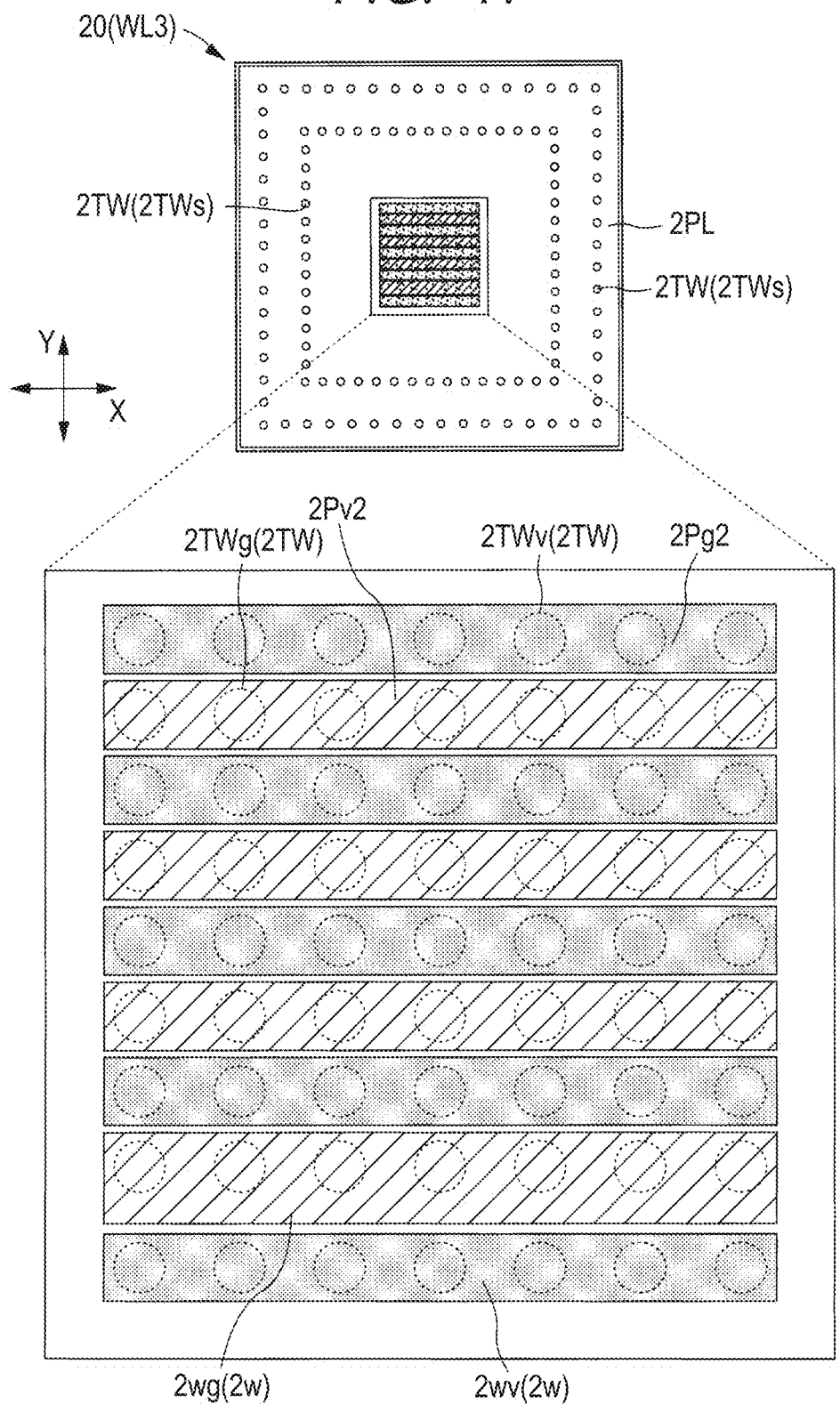
FIG. 17 is a plan view illustrating a layout example of a wiring layer as the third layer, on the wiring substrate illustrated in FIG. 7.
Figure 18:
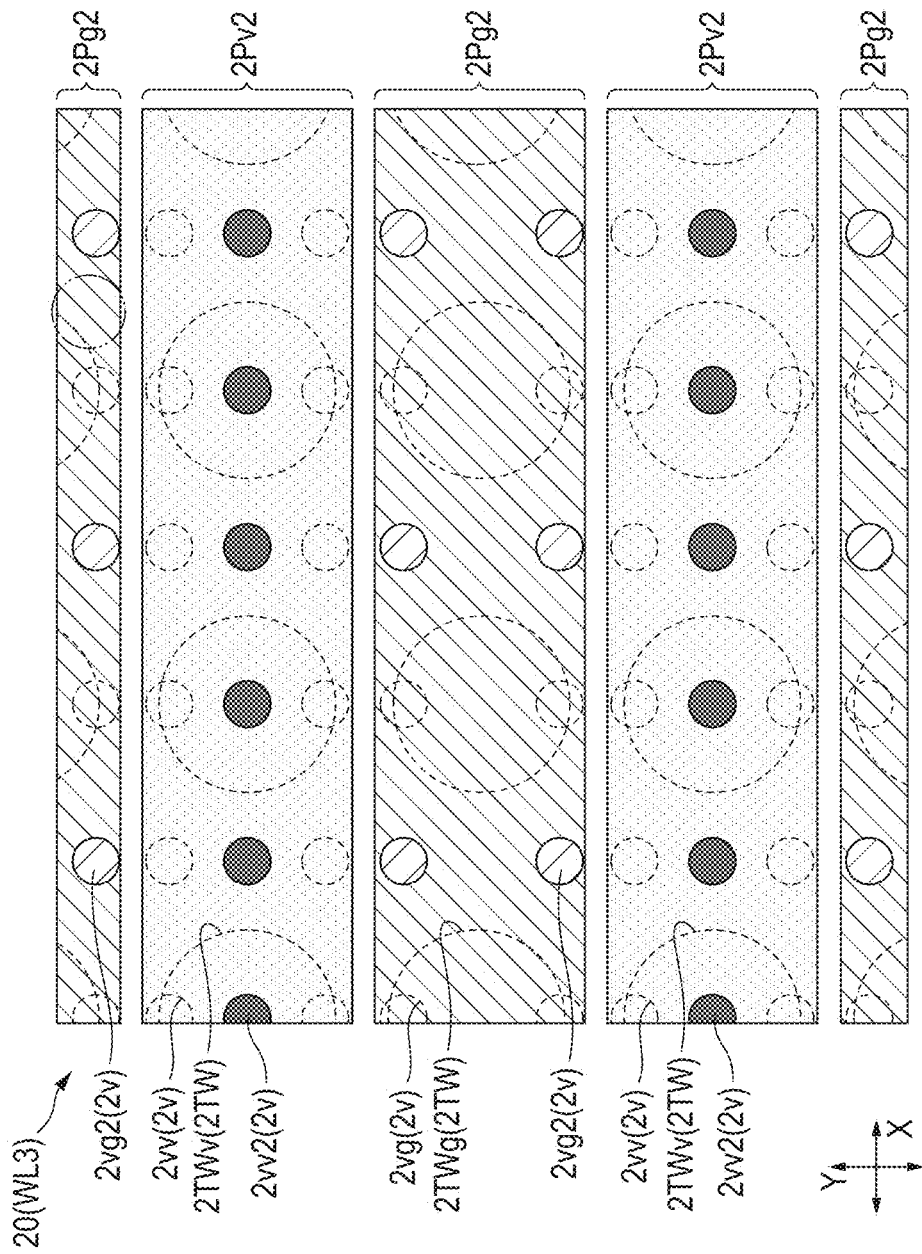
FIG. 18 is an enlarged plan view of a position corresponding to FIG. 9, on the wiring layer illustrated in FIG. 17.

The wiring substrate 20 has the wiring layer WL3 illustrated in FIG. 17. FIG. 17 is a plan view illustrating a layout example of a wiring layer as the third layer, on the wiring substrate illustrated in FIG. 7. FIG. 18 is an enlarged plan view of a position corresponding to FIG. 9, on the wiring layer illustrated in FIG. 17.

As illustrated in FIG. 4, the wiring layer WL3 is provided between the wiring layer WL2 and the lower surface 20b, and is formed adjacent to the wiring layer WL2 in a cross sectional view in a direction crossing the upper surface 20t. As illustrated in FIG. 18, the wiring layer WL3 has a conductor pattern 2Pv2, overlapping with the conductor pattern 2Pv1 (see FIG. 12), electrically coupled with the conductor pattern 2Pv1 through a plurality of via wirings (third vias) 2vv2, and extending in the direction "X". The wiring layer WL3 has a conductor pattern 2Pg2, overlapping with the conductor patterns 2Pg1 (see FIG. 4), electrically coupled to the conductor patterns 2Pg1 through a plurality of via wirings (fourth via) 2vg2, and extending in the direction "X". In the example illustrated in FIG. 17 and FIG. 18, the wiring layer WL3 has the conductor patterns 2Pv2 and the conductor patterns 2Pg2. The conductor patterns 2Pv2 and the conductor patterns 2Pg2 are arranged alternately along the direction "Y". In this manner, the conductor pattern 2Pv1 and the conductor pattern 2Pv2 forming the path for supplying a power source potential are overlapped on the wiring layer upper than the insulating layer (core layer, core member, core insulating film) 2CR (see FIG. 4), thereby electrically coupling the conductor pattern 2Pv1 and the conductor pattern 2Pv2 through the via wirings 2vv2. As a result, it is possible to increase the number of paths for supplying a power source potential. Similarly, on the wiring layer upper than the insulating layer (core layer, core member, core insulating layer) 2CR (see FIG. 4), the conductor pattern 2Pg1 and the conductor pattern 2Pg2 forming the path for supplying a reference potential are overlapped with each other, thereby electrically coupling the conductor pattern 2Pg1 and the conductor pattern 2Pg2 through the via wirings 2vg2. As a result, it is possible to increase the number of paths for supplying a reference potential.

To the conductor patterns 2Pv2, a plurality of through hole wirings 2TWv are coupled. In other words, as illustrated in FIG. 4, the wiring substrate 20 has the wiring layer WL4 provided between the wiring layer WL3 and the lower surface 20b. The wiring substrate 20 has the through hole wirings 2TW for electrically coupling the wiring layer WL3 and the wiring layer WL4. The through hole wirings 2TW include a plurality of through hole wirings 2TWv coupled to the conductor pattern 2Pv2 on the wiring layer WL3 and a plurality of through hole wirings 2TWg coupled to the conductor pattern 2Pg2 on the wiring layer WL3.

The arrangement pitch of the electrodes 1PD illustrated in FIG. 6 is narrowed. As compared with the narrowed arrangement pitch of the electrodes 1PD, it is difficult to form the narrow arrangement pitch of the through hole wirings 2TW. Thus, the arrangement pitch of the electrodes 1PD of the semiconductor chip illustrated in FIG. 6 is smaller than the arrangement pitch of the through hole wirings 2TW of the wiring substrate 20 illustrated in FIG. 17. Specifically, of the wiring layer WL3 illustrated in FIG. 17, the arrangement pitch of the through hole wirings 2TW (in other words, the through hole wiring 2TWv and the through hole wiring 2TWg) arranged in a region overlapping with the semiconductor chip 10 illustrated in FIG. 4 is larger than the arrangement pitch of the electrodes 1PD of the semiconductor chip 10 illustrated in FIG. 6. Thus, the width (the length in a direction crossing the direction "X" as the extending direction) of the semiconductor pattern 2Pv2 and the conductor pattern 2Pg2 illustrated in FIG. 18 is larger than the width of the main wiring unit 2wv1 of the wiring 2wv illustrated in FIG. 9. The width of the conductor pattern 2Pv2 and the conductor pattern 2Pg2 illustrated in FIG. 18 is larger than the width of the main wiring unit 2wg1 of the wiring 2wg.

Figure 19:
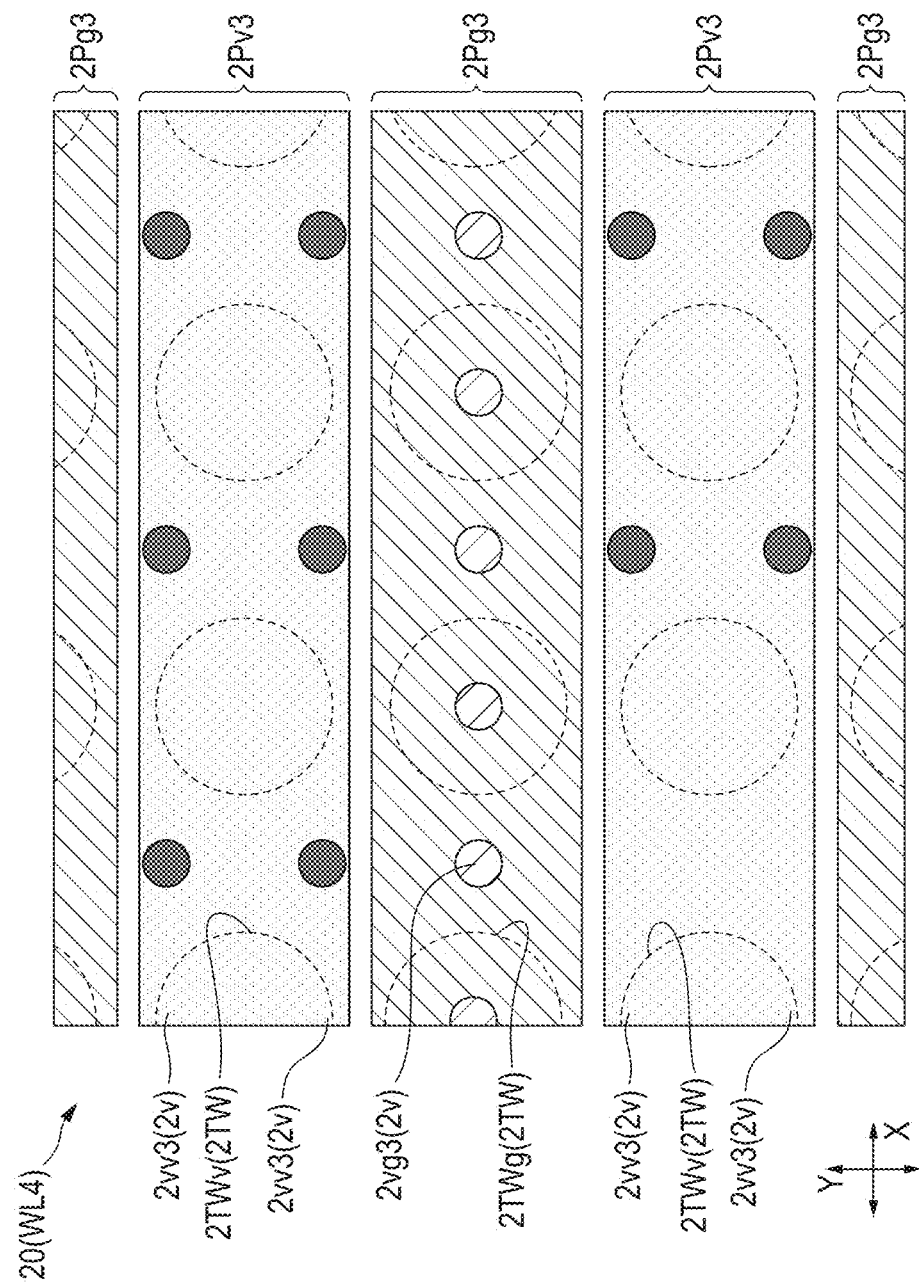
FIG. 19 is an enlarged plan view illustrating a layout example of a wiring layer as the fourth layer, on the wiring substrate illustrated in FIG. 9.

FIG. 19 is an enlarged plan view illustrating a layout example of a wiring layer as the fourth layer, on the wiring substrate illustrated in FIG. 9. As illustrated in FIG. 4, the wiring layer WL4 is formed between the wiring layer WL3 and the lower surface 20b, and is adjacent to the wiring layer WL3 in a cross sectional view in a direction crossing the upper surface 20t. As illustrated in FIG. 19, the wiring layer WL4 has the conductor patterns 2Pv3, overlapping with the conductor patterns 2Pv2 (see FIG. 18), electrically coupled with the conductor patterns 2Pv2 through the through hole wirings 2TWv, and extending in the direction "X". The wiring layer WL4 has the conductor patterns 2Pg3, overlapping with the conductor patterns 2Pg2 (see FIG. 18), electrically coupled with the conductor patterns 2Pg2 through the through hole wirings 2TWg, and extending in the direction "X". In the example illustrated in FIG. 19, the wiring layer WL4 has a plurality of conductor patterns 2Pv3 and a plurality of conductor patterns 2Pg3. The conductor patterns 2Pv3 and the conductor patterns 2Pg3 are alternately arranged in the direction "Y". To the conductor patterns 2Pv3, the via wirings 2vv3 for electrically coupling the wiring layer WL4 and the wiring layer WL5 (see FIG. 4) are coupled. To the conductor patterns 2Pg3, a plurality of via wirings 2vg3 for electrically coupling the wiring layer WL4 and the wiring layer WL5 are coupled.

Figure 20:
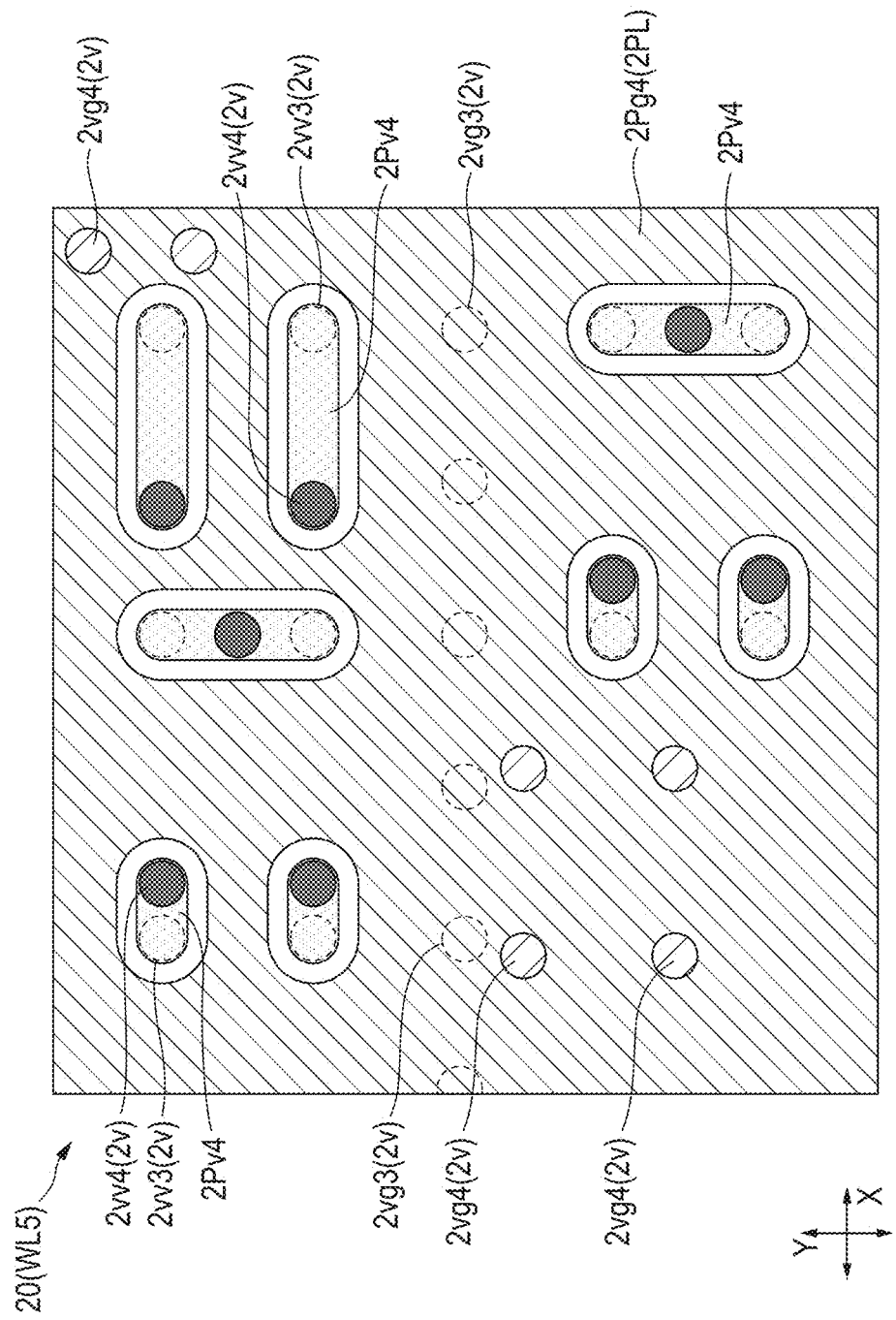
FIG. 20 is an enlarged plan view illustrating a layout example of a wiring layer as the fifth layer, on the wiring substrate illustrated in FIG. 9.

FIG. 20 is an enlarged plan view illustrating a layout example of a wiring layer as the fifth layer, on the wiring substrate illustrated in FIG. 9. As illustrated in FIG. 4, the wiring layer WL5 is provided between the wiring layer WL4 and the lower surface 20b, and provided adjacent to the wiring layer WL4 in a cross sectional view in the direction crossing the upper surface 20t. As illustrated in FIG. 20, the wiring layer WL5 has a plurality of conductor patterns 2Pv4, overlapping with the conductor patters 2Pv3 (see FIG. 19) and electrically coupled with the conductor patterns 2Pv3 through the via wirings 2vv3. The wiring layer WL5 has a conductor pattern 2Pg4, overlapping with the conductor patterns 2Pg3 (see FIG. 19) and electrically coupled to the conductor patterns 2Pg3 through the via wirings 2vg3. In this embodiment, the conductor pattern 2Pg4 is a conductor pattern, having a large area and incorporated with the conductor plane 2PL. The conductor patterns 2Pv4 are wiring patterns for electrically coupling the via wirings 2vv3 and via wirings 2vv4. The conductor patterns 2Pv4 have an area smaller than that of the conductor pattern 2Pg4. To the conductor patterns 2Pv4, the via wirings 2vv4 for electrically coupling the wiring layer WL5 and the wiring layer WL6 (see FIG. 4) are coupled. To the conductor pattern 2Pg4, a plurality of via wirings 2vg4 for electrically coupling the wiring layer WL5 and the wiring layer WL6 are coupled.

Figure 21:
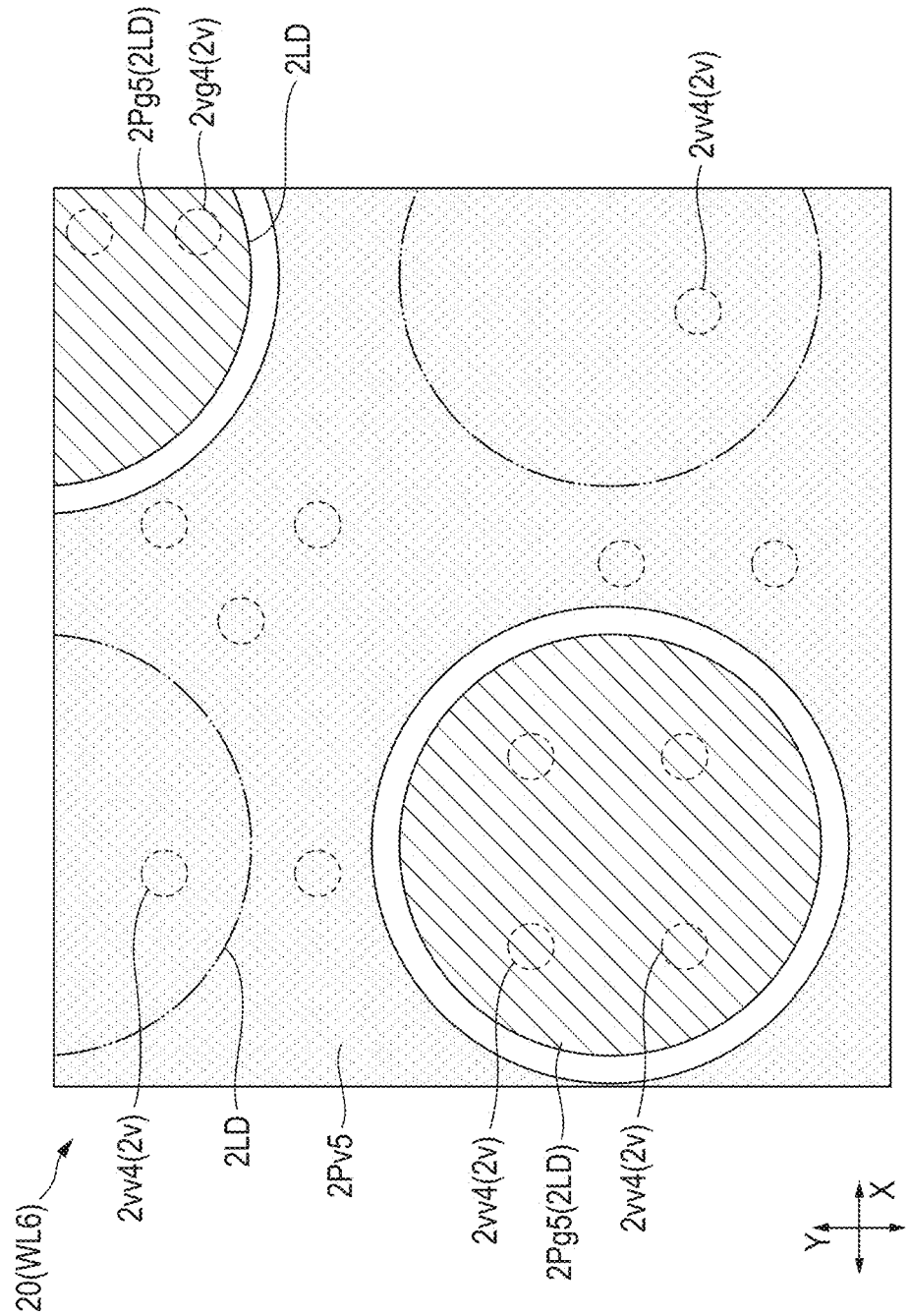
FIG. 21 is an enlarged plan view illustrating a layout example of a wiring layer as the sixth layer, on the wiring substrate illustrated in FIG. 9.

FIG. 21 is an enlarged plan view illustrating a layout example of a wiring layer as the sixth layer, on the wiring substrate illustrated in FIG. 9. As illustrated in FIG. 4, the wiring layer WL6 is provided between the wiring layer WL5 and the lower surface 20b, and adjacent to the wiring layer WL5 in a cross sectional view in the direction crossing the upper surface 20t. As illustrated in FIG. 21, the wiring layer WL6 has a conductor pattern 2Pv5, overlapping with the conductor patterns 2Pv4 (see FIG. 20), and is electrically coupled to the conductor patterns 2Pv4 through the via wirings 2vv4. The wiring layer WL6 has conductor patterns 2Pg5, overlapping with the conductor pattern 2Pg4 (see FIG. 20) and electrically coupled with the conductor pattern 2Pg4 through the via wirings 2vg4. In this embodiment, the conductor patterns 2Pg5 are lands 2LD which function as external terminals for supplying a reference potential, of the wiring substrate 20. In this embodiment, the conductor pattern 2Pv5 has an area larger than that of the conductor patterns 2Pg5. A part of the conductor pattern 2Pv5 is included in the lands 2LD which function as external terminals for supplying a power source potential, of the wiring substrate 20.

As illustrated in FIG. 20 and FIG. 21, in this embodiment, there is provided a conductor pattern having a large area and for transmitting a reference potential to the wiring layer WL5, and there is also provided a conductor pattern having a large area and for supplying a power source potential to the wiring layer WL6. In this manner, it is possible to stabilize the potential of the path for supplying a power source potential and the path for supplying a reference potential, by providing the large area conductor patterns for a power source potential and a reference potential in the wiring substrate 20.

The descriptions have been made to some modifications of the above embodiment. Now, descriptions will be made to any typical modification other than the modifications of the above-described embodiment.

<First Modification>

Figure 22:
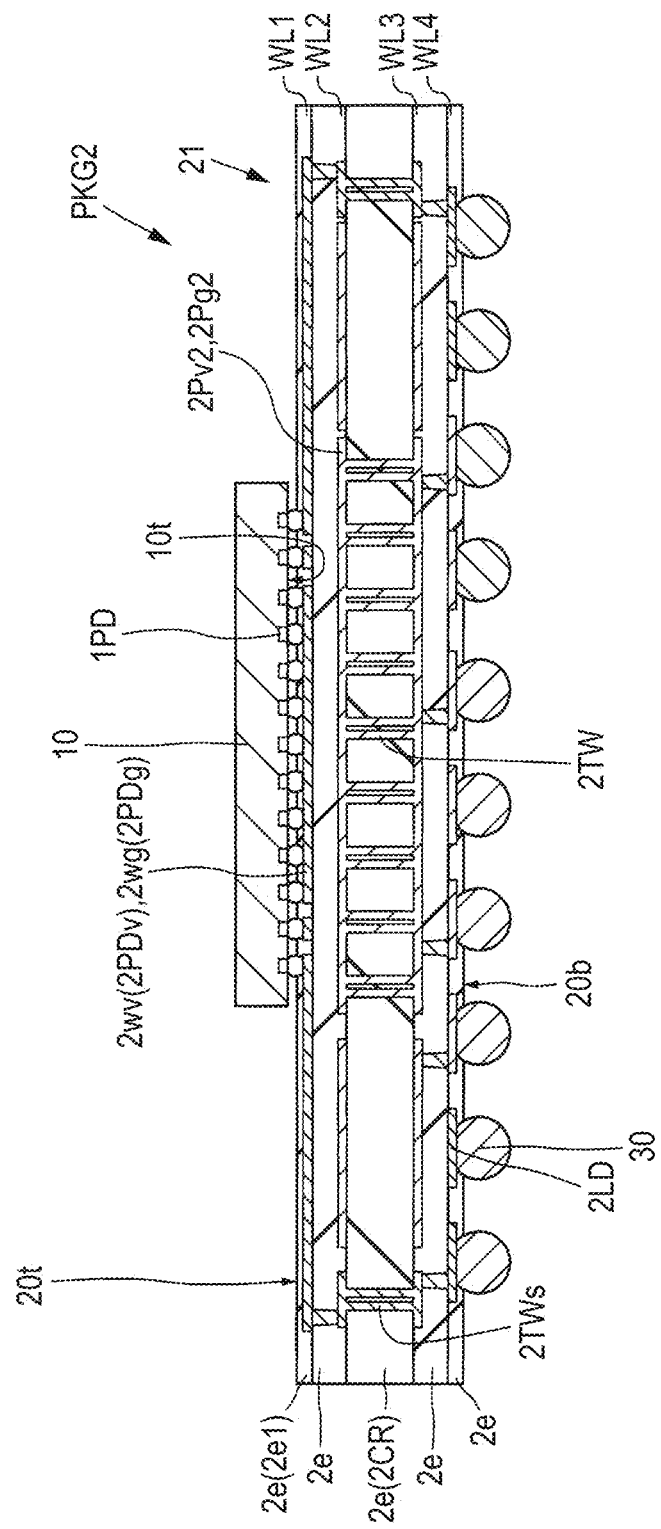
FIG. 22 is a cross sectional view of a semiconductor device according to a modification of FIG. 4.
Figure 23:
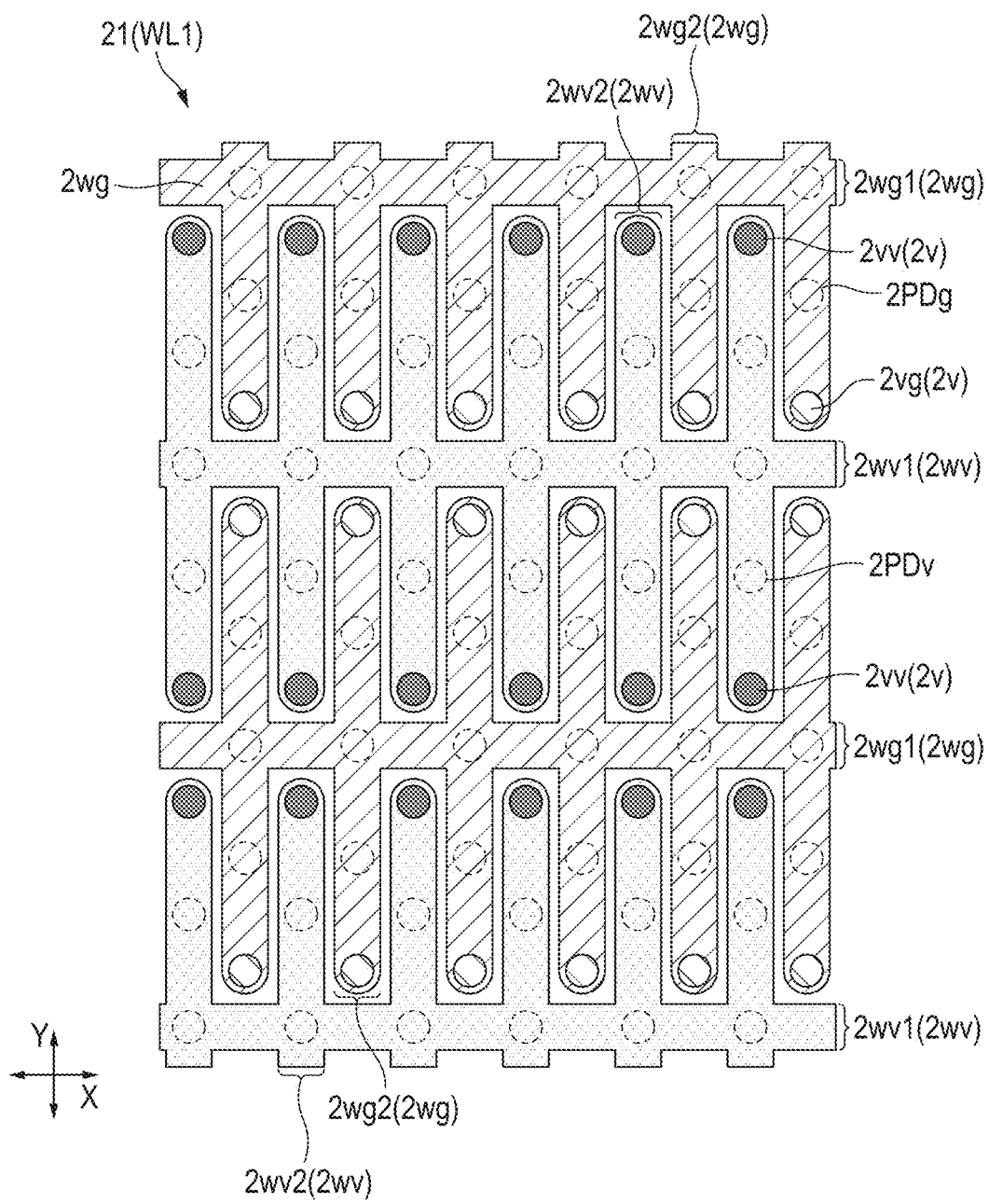
FIG. 23 is an enlarged plan view illustrating a layout example of a wiring layer as the first layer, on the wiring substrate illustrated in FIG. 22.
Figure 24:
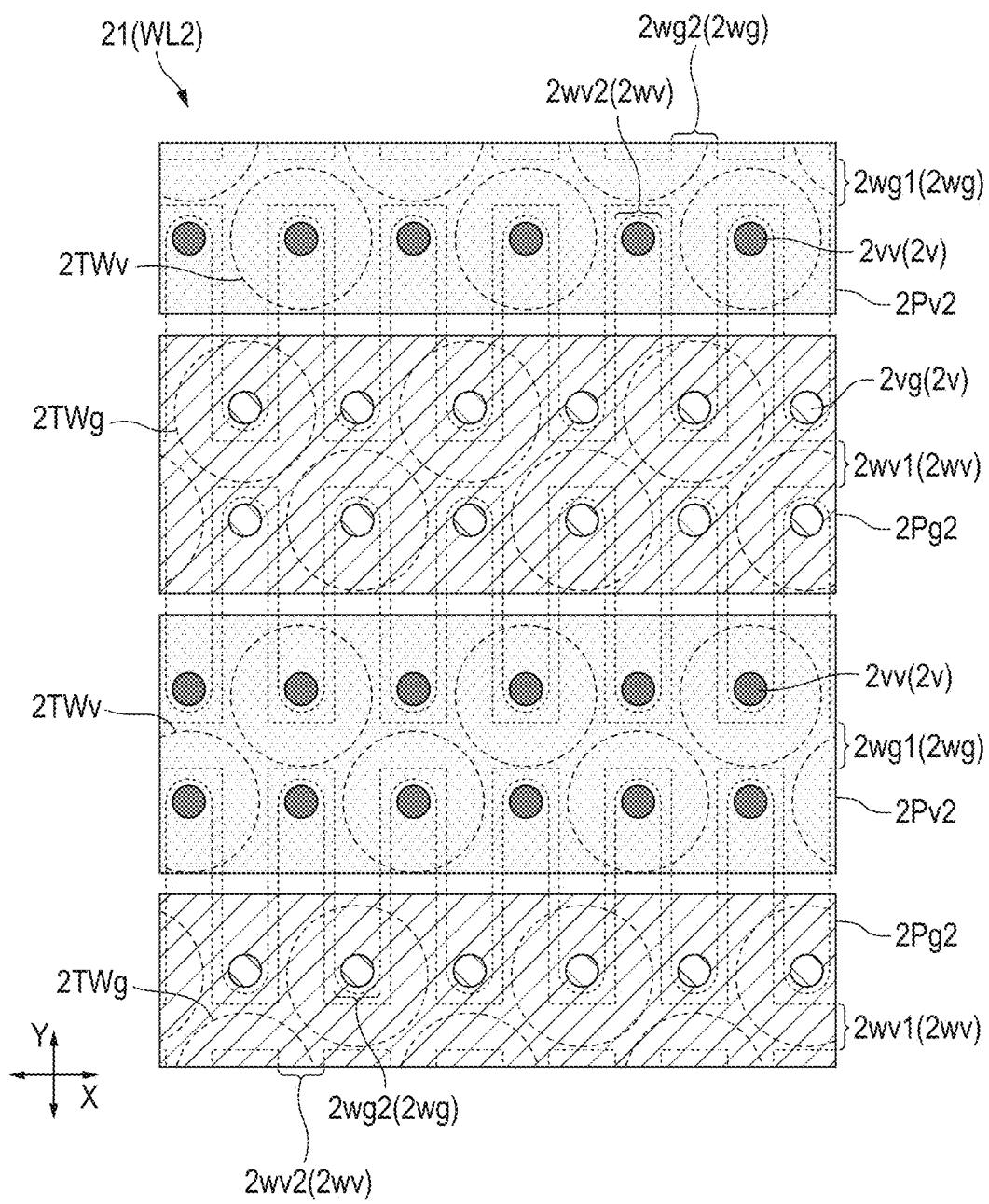
FIG. 24 is an enlarged plan view illustrating a layout example of a wiring layer as the second layer, on the wiring substrate illustrated in FIG. 23.

The descriptions have been made to the wiring substrate 20 having the wiring layer with six layers, as a structure example of the wiring substrate, for example, in the semiconductor device PKG1 illustrated in FIG. 4. The number of wiring layers is not limited to six, and various modifications are applicable. FIG. 22 is across sectional view of a semiconductor device according to a modification of FIG. 4. FIG. 23 is an enlarged plan view illustrating a layout example of a wiring layer as the first layer, on the wiring substrate illustrated in FIG. 22. FIG. 24 is an enlarged plan view illustrating a layout example of a wiring layer as the second layer, on the wiring substrate illustrated in FIG. 23.

A wiring substrate 21 included in the semiconductor device PKG2 of FIG. 22 differs from the semiconductor device PKG1 illustrated in FIG. 4 in a manner that it includes the wiring layer with four layers. In the case of the semiconductor device PKG2, a wiring layer WL2 is provided on the insulating layer 2CR as the core insulating layer. Thus, the wiring 2wv and the pattern of the wiring 2wv provided on the wiring layer WL1 need to be formed in accordance with the arrangement of the through hole wirings 2TW. For example, when the arrangement pitch of the electrodes 1PD is smaller than the arrangement pitch of the through hole wiring 2TW, if the same layout as that of the wiring layer WL1 of the wiring substrate 20 illustrated in FIG. 9 is applied to the wiring substrate illustrated in FIG. 22, it may not be possible to match appropriately the positional relationship between both end units of the sub-wiring units 2wv2 and 2wg2 and the conductor patterns 2Pw2 and 2Pg2 of the wiring layer WL2. As illustrated in FIG. 23, it is possible to have a longer length of the sub-wiring units 2wv2 in the direction "Y" and a longer length of the sub-wiring units 2wg2 in the direction "Y", than the length in the example illustrated FIG. 9.

In the example illustrated in FIG. 23, in the wiring 2wv, the terminals 2PDv are provided in both end units of the sub-wiring units 2wv2 and in the main wiring unit 2wv1, and also provided between the main wiring unit 2wv1 and the end units of the sub-wiring unit 2wv2s. The via wirings 2vv are coupled to both end units of the sub-wiring units 2wv2, and are not coupled to any other parts. Similarly, in the wiring 2wg, the terminals 2PDg are provided in both end units of the sub-wiring units 2wg2 and also in the main wiring unit 2wg1, and are provided also between the main wiring unit 2wg1 and the end units of the sub-wiring units 2wg2. The via wirings 2vg are coupled to both end units of the sub-wiring units 2wg2, but not coupled to any other parts.

In the example illustrated in FIG. 24, to reduce the impedance of the paths for supplying a power source potential and a reference potential, the through hole wirings 2TWv and the through hole wiring 2TWg are arranged in plural rows (two rows in FIG. 24) in the direction "Y". Thus, a larger width (length) is formed in the conductor pattern 2Pv2 overlapping with the main wiring unit 2wg1 of the wiring 2wg and also in the conductor patterns 2Pg2 overlapping with the main wiring unit 2wv1 of the wiring 2wv in the direction "Y", than the width (length) of the conductor pattern 2Pv1 and the conductor pattern 2Pg1 illustrated in FIG. 11. According to this modification, even when the conductor pattern 2Pv2 and the conductor pattern 2Pg2 have a large width, it is possible to have a plurality of paths for supplying a power source potential and a plurality of paths for supplying a reference potential.

If the length of the sub-wiring units 2wv2 and the sub-wiring units 2wg2 is made long, the path for supplying a power source potential and the path for supplying a reference potential are made longer than those of the example illustrated in FIG. 9. From a view point of shortening the path distance of the conductive path, as illustrated in FIG. 9, the terminals 2PDv are preferably provided in both end units of the sub-wiring units 2wv2 and in the main wiring unit 2wv1, but are preferably not provided between the main wiring unit 2wv1 and the end units of the sub-wiring units 2wv2. The terminals 2PDg are preferably provided in both end units of the sub-wiring units 2wg2 and in the main wiring unit 2wg1, but are preferably not provided between the main wiring unit 2wg1 and the end units of the sub-wiring units 2wg2.

In the case of the semiconductor device PKG1 illustrated in FIG. 4 and the semiconductor device PKG2 illustrated in FIG. 22, the wiring 2wg and the wiring 2wv are arranged on the wiring layer WL1 as the uppermost layer, and the wiring 2wg and a part of the wiring 2wv are provided to form the terminals 2PD of the wiring substrates 20 and 21. However, as a modification, there may be provided a wiring layer for arranging the terminals 2PD on the upper layer (the upper surface 20t side) above the wiring layer WL1. In this case, the wiring 2wg and the wiring 2wv are formed on the lower layer of the wiring layer where the terminals 2PD are formed, and are electrically coupled through non-illustrative via wirings. In this modification, there is some room for the arrangement space of the terminals 2PD, thereby increasing the area of the conductor patterns of the terminals 2PD. From a view point of shortening the paths for supplying a power source potential and a reference potential, the wiring 2wg and the wring 2wv are preferably arranged on the uppermost layer, as illustrated in FIG. 4 and FIG. 22.

Except the above difference, the wiring substrate 21 illustrated in FIG. 22 to FIG. 24 is the same as the wiring substrate 20 illustrated in FIG. 4. Thus, the descriptions will not be made over and over.

<Second Modification>

For example, in FIG. 4, the descriptions have been made to the case in which the semiconductor chip 10 and the wiring substrate 20 are electrically coupled through the bump electrodes SB. It shall not be excluded that the above techniques are applicable to the wiring device in which the semiconductor chip 10 and the wiring substrate 20 are electrically coupled with each other through the wire. Note, however, that it is particularly preferred that the flip-chip coupling system is applied as described above, from a view point of reducing the impedance of the conductive path for electrically coupling the wiring substrate 20 and the semiconductor chip 10. It is particularly preferred that the flip-chip coupling system is applied, from a view point of shortening the path for supplying a power source potential in the wiring substrate 20 and the path for supplying a reference potential.

<Third Modification>

For example, the descriptions have been made to the various modifications, and the above modifications can be combined together to be applied.

The inventions by the present inventors have specifically been described based on the preferred embodiment. The present invention is not limited to the preferred embodiment, and various changes may be made without departing from the scope thereof.

What is claimed is:

1. A semiconductor device comprising:
   a semiconductor chip which has a first surface, a first back surface on a side opposed to the first surface, and a plurality of electrodes arranged on the first surface; and
   a wiring substrate which has a first main surface on which the semiconductor chip is mounted, a second main surface on a side opposed to the first main surface, a first wiring layer which is formed between the first main surface and the second main surface, and a second wiring layer which is formed between the first wiring layer and the second main surface and adjacent to the first wiring layer in a cross sectional view in a direction crossing the first main surface,
   wherein the first wiring layer has
      a first wiring having a first main wiring unit extending in a first direction in a cross sectional view and a plurality of first sub-wiring units, extending in a second direction crossing the first direction and crossing the first main wiring unit, and the first wiring being supplied with a first potential,
      a second wiring having a second main wiring unit extending in the first direction in the cross sectional view and a plurality of second sub-wiring units, extending in the second direction and crossing the second main wiring unit, and the second wiring being supplied with a second potential different from the first potential,
   wherein the first sub-wiring units of the first wiring and the second sub-wiring units of the second wiring
      have a first end unit and a second end unit on a side opposed to the first end unit through the first main wiring unit or the second main wiring unit in the second direction, and
      are alternately arranged along the first direction, between the first main wiring unit and the second main wiring unit, wherein the second wiring has
 a first conductor pattern which overlaps with the second main wiring unit of the second wiring and the first end unit of the first sub-wiring units of the first wiring, and extends in the first direction, and
 a second conductor pattern which overlaps with the first main wiring unit of the first wiring and the second end unit of the second sub-wiring units of the second wiring,
wherein the first end unit of the first sub-wiring units is electrically coupled with the first conductor pattern through a plurality of first vias, and
wherein the second unit of the second sub-wiring units is electrically coupled with the second conductor pattern through a plurality of vias.

2. The semiconductor device according to claim 1,
wherein the first surface of the semiconductor chip is opposed to the first main surface of the wiring substrate;
wherein the electrodes of the semiconductor chip include
 a plurality of first electrodes electrically coupled to the first wiring of the wiring substrate, and
 a plurality of second electrodes electrically coupled to the second wiring of the wiring substrate, and
wherein the wiring substrate has
 a plurality of first terminals opposed to and electrically coupled with the first electrodes of the semiconductor chip and
 a plurality of second terminals opposed to and electrically coupled with the second electrodes of the semiconductor chip.

3. The semiconductor device according to claim 2,
wherein the wiring substrate has a first insulating film covering the first wiring layer and including a plurality of openings,
wherein the first wiring has the first terminals exposed from the first insulating film in the openings included in the first insulating film,
wherein the second wiring has the second terminals exposed from the first insulating film in the openings included in the first insulating film,
wherein the first electrodes of the semiconductor chip and the first terminals are coupled through first bump electrodes, and
wherein the second electrodes of the semiconductor chip and the second terminals are coupled through a second bump electrode.

4. The semiconductor device according to claim 3,
wherein the first terminals include a plurality of third terminals formed in the first end unit and the second end unit of the first sub-wiring units, and
wherein the second terminals include a plurality of fourth terminals formed in the third end unit and the second end unit of the sub-wiring units.

5. The semiconductor device according to claim 4,
wherein the third terminals respectively overlap with the first vias, and
wherein the fourth terminals respectively overlap with the second vias.

6. The semiconductor device according to claim 4,
wherein the first terminals include a fifth terminal formed in the first main wiring unit, and
wherein the second terminals include a sixth terminal formed in the second main wiring unit.

7. The semiconductor device according to claim 6,
wherein the fifth terminal does not overlap with the first vias, and
wherein the sixth terminal does not overlap with the second vias.

8. The semiconductor device according to claim 1,
wherein the second wiring layer has a third conductor pattern overlapping with the second end unit of the first sub-wiring units of the first wiring and extending in the first direction,
wherein the second conductor pattern is provided between the first conductor pattern and the third conductor pattern in a cross sectional view, and
wherein the second end units of the first sub-wiring units are electrically coupled to the third conductor pattern through the first vias.

9. The semiconductor device according to claim 8,
wherein the second wiring layer has the second conductor patterns arranged between the first conductor pattern and the third conductor pattern in the second direction and arranged in one row along the first direction, and
wherein the first conductor pattern and the third conductor pattern are electrically coupled with each other through a connecting unit formed between the second conductor patterns.

10. The semiconductor device according to claim 8,
wherein the second wiring layer has a fourth conductor pattern overlapping with the first end units of the second sub-wiring units of the second wiring,
wherein the first conductor pattern is formed between the second conductor pattern and the fourth conductor pattern in a cross sectional view, and
wherein the first end units of the second sub-wiring units are electrically coupled with the fourth conductor pattern through the second vias.

11. The semiconductor device according to claim 10,
wherein the second wiring layer has the second conductor patterns which are arranged between the first conductor pattern and the third conductor pattern in the second direction, and are arranged in one row along the first direction, and
wherein the second conductor patterns are electrically coupled with each other through the second wiring of the first wiring layer.

12. The semiconductor device according to claim 1,
wherein the wiring substrate has a third wiring layer which is formed between the second wiring layer and the second main surface, and is adjacent to the second wiring layer in a cross sectional view in a direction crossing the first main surface,
wherein the third wiring layer has
 a third conductor pattern, overlapping with the first conductor pattern, electrically coupled with the first conductor pattern through a plurality of third vias, and extending in the first direction, and
 a fourth conductor pattern, overlapping with the second conductor pattern, electrically coupled with the second conductor pattern through a plurality of fourth vias, and extending in the first direction.

13. The semiconductor device according to claim 12,
wherein the wiring substrate has
 a fourth wiring layer formed between the third wiring layer and the second main surface, and
 a plurality of through hole wirings for electrically coupling the third wiring layer and the fourth wiring layer, and
wherein the through hole wirings include a plurality of first through hole wirings coupled to the third conductor pattern in the third wiring layer and a plurality of second through hole wirings coupled to the fourth conductor pattern in the third wiring layer.

14. The semiconductor device according to claim 13,
wherein an arrangement pitch of the electrodes of the semiconductor chip is smaller than an arrangement pitch of the through hole wirings of the wiring substrate.

15. The semiconductor device according to claim 1,
wherein the first wiring layer of the wiring substrate has a plurality of first wirings and a plurality of second wirings,
wherein the first wirings and the second wirings are alternately arranged along the second direction, in a cross sectional view.

16. The semiconductor device according to claim 1,
wherein the first wiring layer has a third wiring having a third main wiring unit extending in the first direction in a cross sectional view and a plurality of third sub-wiring units extending in the second direction and crossing the third main wiring unit, and the third wiring being supplied with the second potential,
wherein the first wiring is arranged between the second wiring and the third wiring in the second direction,
wherein the third sub-wiring units of the third wiring have the first end unit and the second end unit on a side opposed to the first end unit through the third main wiring unit in the second direction,
wherein the first sub-wiring units and the third sub-wiring units are alternately arranged along the first direction, between the second main wiring unit and the third main wiring unit,
wherein the second wiring layer has a third conductor pattern overlapping with the third main wiring unit of the third wiring and the second end units of the first sub-wiring units of the first wiring,
wherein the second end units of the first sub-wiring units are electrically coupled with the third conductor pattern through the first vias, and
wherein the first end units of the third sub-wiring units are electrically coupled with the second conductor pattern through the second vias.

17. The semiconductor device according to claim 1,
wherein the first wiring layer has a fourth wiring having a fourth main wiring unit extending in the first direction in a cross sectional view and a plurality of fourth sub-wiring units extending in the second direction and crossing the fourth main wiring unit, the fourth wiring being supplied with the first potential,
wherein the second wiring is arranged between the first wiring and the fourth wiring in the second direction,
wherein each of the fourth sub-wiring units of the fourth wiring has the first end unit and the second end unit on a side opposed to the first end unit through the fourth main wiring unit in the second direction,
wherein the second sub-wiring units and the fourth sub-wiring units are alternately arranged along the first direction between the second main wiring unit and the fourth main wiring unit,
wherein the second wiring layer has a fourth conductor pattern overlapping with the fourth main wiring unit of the fourth wiring and the second end units of the first sub-wiring units of the first wiring,
wherein the first end units of the second sub-wiring units are electrically coupled with the fourth conductor pattern through the second vias, and
wherein the first end units of the fourth sub-wiring units are electrically coupled with the first conductor pattern through the first vias.

18. The semiconductor device according to claim 1,
wherein the semiconductor chip has a circuit which is driven by a potential difference between the first potential and the second potential, and
wherein the second potential is a ground potential, and the first potential is a power source potential different from the ground potential.

* * * * *